(12) United States Patent
Ariyawansa et al.

(10) Patent No.: US 10,777,696 B1
(45) Date of Patent: Sep. 15, 2020

(54) HIGH ABSORPTION INFRARED SUPERLATTICES

(71) Applicant: Government of the United States, as represented by the Secretary of the Air Force, Wright-Paterson AFB, OH (US)

(72) Inventors: Gamini Ariyawansa, Dayton, OH (US); Charles J. Reyner, Mason, OH (US); John E. Scheihing, Yellow Springs, OH (US); Joshua M. Duran, Dayton, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 16/519,083

(22) Filed: Jul. 23, 2019

Related U.S. Application Data

(62) Division of application No. 15/861,825, filed on Jan. 4, 2018, now Pat. No. 10,411,146.

(Continued)

(51) Int. Cl.
*H01L 31/0352* (2006.01)
*H01L 31/0304* (2006.01)
(Continued)

(52) U.S. Cl.
CPC ........... *H01L 31/035236* (2013.01); *H01L 31/03046* (2013.01); *H01L 31/1844* (2013.01); *H01L 31/109* (2013.01)

(58) Field of Classification Search
CPC ....... H01L 31/035236; H01L 31/03046; H01L 31/1844; H01L 31/109
See application file for complete search history.

(56) References Cited

U.S. PATENT DOCUMENTS

| 5,065,205 A | 11/1991 | Biefeld et al. |
| 5,451,552 A | 9/1995 | Miles et al. |

(Continued)

OTHER PUBLICATIONS

Ariyawansa et al. ("InGaAs/InAsSb strained layer superlattices for mid-wave infrared detectors," App. Phys. Lett. 108, 022106, Jan. 13, 2016) (Year: 2016).*

(Continued)

*Primary Examiner* — Yasser A Abdelaziez
(74) *Attorney, Agent, or Firm* — AFMCLO/JAZ; James F McBride

(57) ABSTRACT

A ternary superlattice structure includes a substrate and periodic layer structure on the substrate and having alternating infrared absorbing semiconductor materials having a first layer of $InAs_{[1-x]}Sb_{[x]}$ ternary alloy material, and a second layer of $In_{[1-y]}Z_{[y]}As$ ternary alloy material, wherein Z is Ga or Al, wherein x is in a range of greater than zero and less than one, wherein y is in a range of greater than zero and less than one, and wherein a thickness of each of the first and second layers are substantially similar and configured to absorb light in a predetermined spectral band and prevent trapping of carriers in any particular layer. In examples, y is in a range from about 0.05 to about 0.35, and x is in a range of about 0.2 to about 0.8.

14 Claims, 16 Drawing Sheets

Related U.S. Application Data

(60) Provisional application No. 62/443,428, filed on Jan. 6, 2017.

(51) Int. Cl.
  *H01L 31/18* (2006.01)
  *H01L 31/109* (2006.01)

(56) References Cited

U.S. PATENT DOCUMENTS

| | | |
|---|---|---|
| 5,536,948 A | 7/1996 | Lee |
| 5,625,635 A | 4/1997 | Kurtz et al. |
| 5,658,825 A | 8/1997 | Razeghi |
| 6,864,552 B2 | 3/2005 | Razeghi |
| 7,001,794 B2 | 2/2006 | Razeghi |
| 7,282,777 B1 | 10/2007 | Chuang et al. |
| 7,638,791 B2 | 12/2009 | Razeghi |
| 7,687,871 B2 | 3/2010 | Maimon |
| 7,737,411 B2 | 6/2010 | Gunapala et al. |
| 7,795,640 B2 | 9/2010 | Klipstein |
| 8,003,434 B2 | 8/2011 | Maimon |
| 8,044,435 B2 | 10/2011 | Scott et al. |
| 8,134,516 B1 | 3/2012 | Yaghjian et al. |
| 8,217,480 B2 | 7/2012 | Ting et al. |
| 8,368,051 B2 | 2/2013 | Ting et al. |
| 8,399,910 B2 | 3/2013 | Scott et al. |
| 8,450,773 B1 | 5/2013 | Kim |
| 8,492,702 B2 | 7/2013 | Bahir et al. |
| 8,502,271 B2 | 8/2013 | Scott |
| 8,928,029 B2 | 1/2015 | Ting et al. |
| 8,928,036 B2 | 1/2015 | Ting et al. |
| 9,024,359 B2 | 5/2015 | Scott et al. |
| 9,099,371 B1 | 8/2015 | Crook |
| 9,117,726 B2 | 8/2015 | Maimon |
| 9,123,843 B2 | 9/2015 | Kyono et al. |
| 9,178,089 B1 | 11/2015 | Scott et al. |
| 9,196,769 B2 | 11/2015 | Wei |
| 9,214,581 B2 | 12/2015 | Khoshakhlagh et al. |
| 9,515,210 B2 | 12/2016 | Wei |
| 9,548,408 B2 | 1/2017 | Wei |
| 9,647,155 B1 | 5/2017 | Maimon |
| 9,673,252 B1 | 6/2017 | Crook et al. |
| 9,698,192 B1 | 7/2017 | Crook et al. |
| 9,766,130 B2 | 9/2017 | Maimon |
| 9,799,785 B1* | 10/2017 | Ting ............... H01L 31/035236 |
| 10,411,461 B2 | 9/2019 | Ariyawansa et al. |
| 2002/0140012 A1 | 10/2002 | Droopad |
| 2007/0047068 A1 | 3/2007 | Tanaka et al. |
| 2007/0235758 A1 | 10/2007 | Klipstein |
| 2009/0256231 A1 | 10/2009 | Klipstein |
| 2010/0155777 A1 | 6/2010 | Hill et al. |
| 2015/0097157 A1* | 4/2015 | Onakado ........... H01L 27/14649 257/21 |

OTHER PUBLICATIONS

Ariyawansa et al ("Unipolar infrared detectors based on InGaAs/InAsSb ternary superlattices," Appl. Phys. Lett. 109, 021112, 2016) (Year: 2016).*

Biefeld, R., et al., "Interfaces in InAsSb/InGaAs strained-layer superlattices grown by MOCVD for use in infrared emitters," International Conference on Narrow Gap Semiconductors, Santa Fe, New Mexico, Jan. 9-12, 1995, Published Feb. 1, 1995, 7 pages.

Bhattacharya, P., et al., "Material Properties and Optical Guiding in InGaAs-GaAs Strained Layer Superlattices—Brief Review," Solid-State Electronics, vol. 29, No. 2, pp. 261-267, Feb. 1986.

Von Allmen, P., et al., "Electronic structure and optical transitions in InAsSb/InGaAs quantum dots," 10th International Workshop on Computational Electronics, West Lafayette, Indiana, Oct. 24-27, 2004, Abstract and Figures only, 2 pages.

* cited by examiner

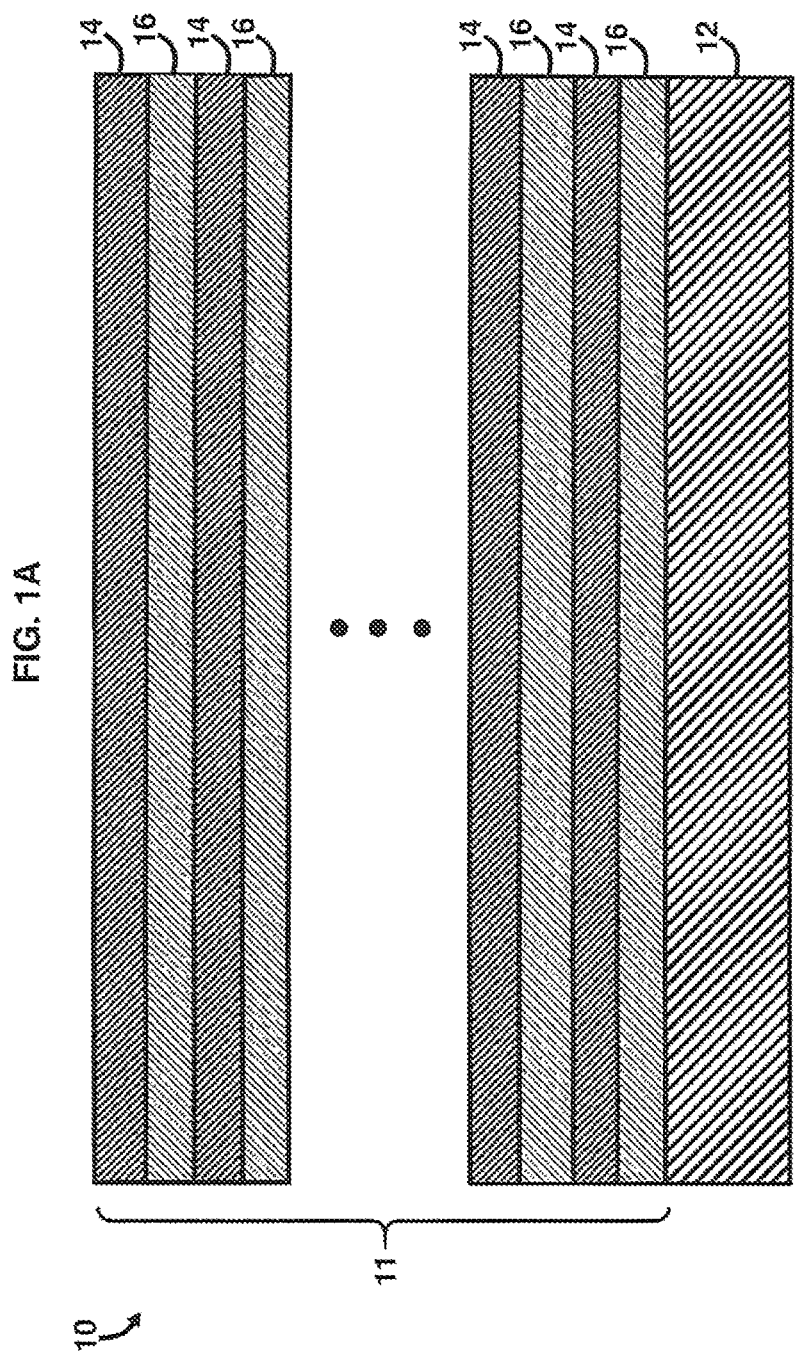

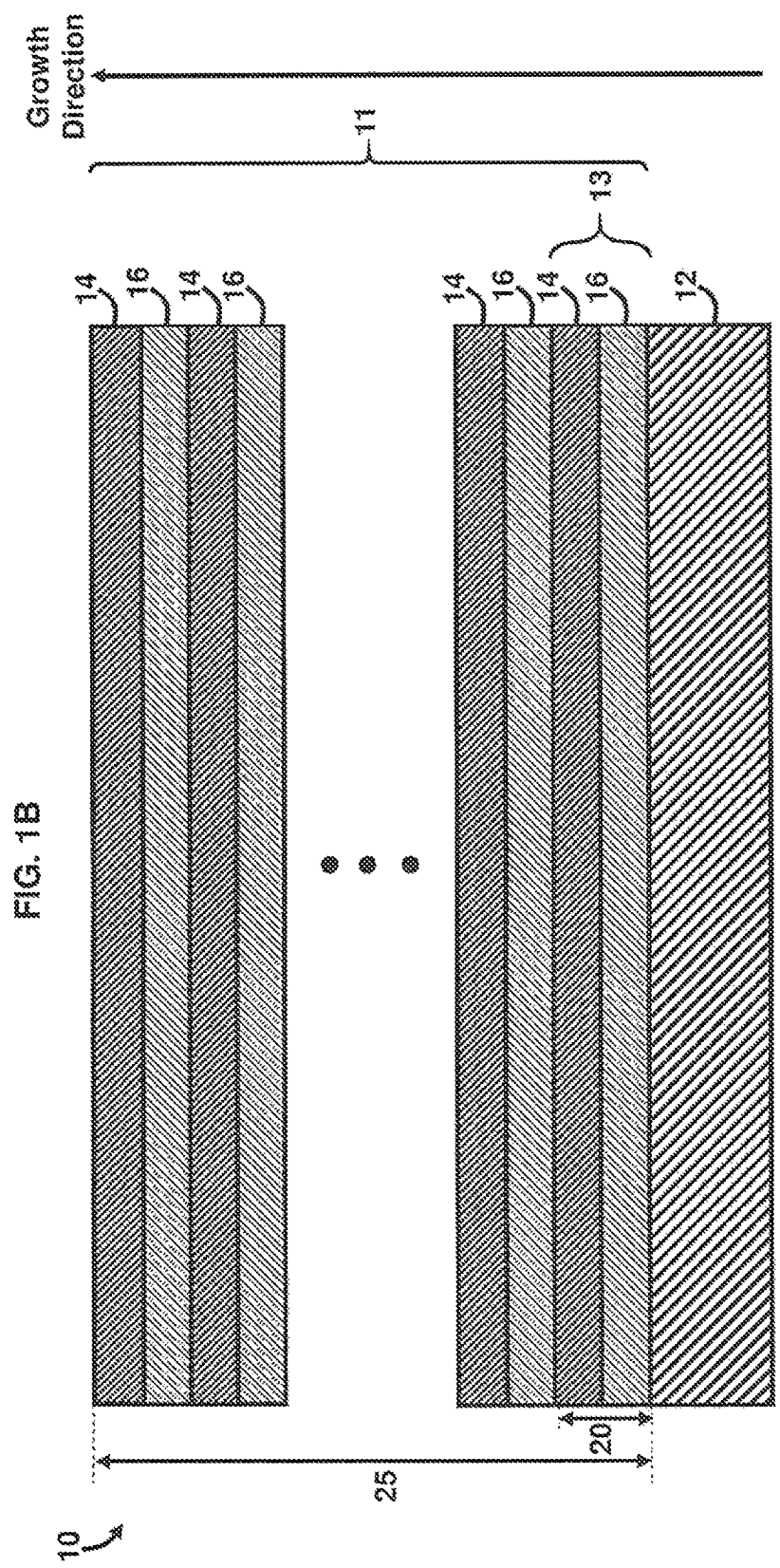

HIGH ABSORPTION INFRARED SUPERLATTICES

CROSS-REFERENCE TO RELATED APPLICATION(S)

The present application is a divisional of U.S. application Ser. No. 15/861,825 filed Jan. 4, 2018, which claims the benefit of U.S. Provisional Application No. 62/443,428 filed, Jan. 6, 2017, the contents of which are hereby incorporated by reference in their entries.

GOVERNMENT INTEREST

The invention described herein may be manufactured and used by or for the Government of the United States for all government purposes without the payment of any royalty.

BACKGROUND

Field of the Invention

The embodiments herein generally relate to infrared detectors, and more particularly to group III-V semiconductor superlattice infrared detectors built based on diode and barrier device architecture.

Background of the Invention

A strained layer superlattice (SLS) is a periodic structure of thin layers made out of semiconductor materials. Superlattice structures are grown layer by layer on a substrate wafer. Group III-V arsenide and antimonide based semiconductor superlattice structures are a preferred material choice for infrared detectors for both mid-wave (MWIR: 3-5 μm) and long wave infrared (LWIR: 8-14 μm) bands. Common material systems for these superlattice structures include InAs/GaSb, InAs/InGaSb, and InAs/InAsSb. The choice of the semiconductor materials depends on various factors such as design aspects, properties of the superlattice structure to be achieved, and material growth feasibility.

Typically, in a strain-compensated superlattice structure, the tensile strain in one layer (e.g., InAs in an InAs/InAs$_{[1-x]}$Sb$_{[x]}$ superlattice structure on GaSb) is compensated by the compressive strain introduced by the other layer (e.g., InAs$_{[1-x]}$Sb$_{[x]}$ in an InAs/InAs$_{[1-x]}$Sb$_{[x]}$ superlattice structure on GaSb). For MWIR InAs/InAsSb superlattice structures, strain compensation is accomplished by adjusting the thickness of the two layers and the Sb composition. This typically results in a thicker InAs layer compared to the InAsSb layer.

A typical superlattice infrared detector structure includes a bottom contact layer, infrared absorber utilizing a superlattice structure, a barrier layer or a depletion region, and a top contact layer, all of which are grown in that order on a preferred substrate. These superlattice detectors are operated as minority carrier devices in which the dark and photo current depend on three basic material properties: minority carrier lifetime, mobility, and absorption coefficient. Although the dark current of today's InAs/InAsSb superlattice detectors are improving, quantum efficiency (QE) in general suffers mainly due to the device active region thickness being limited by the short diffusion length or due to challenges in growing thick active regions. InAs/InAsSb superlattice structures have easily reached the s range for minority carrier lifetime, but the diffusion length is still short due to the poor hole mobility.

The above information disclosed in this Background section is only for enhancement of understanding of the background of the disclosure and therefore it may contain information that does not form any part of the prior art nor what the prior art may suggest to a person of ordinary skill in the art.

BRIEF SUMMARY OF THE INVENTION

In view of the foregoing, an embodiment herein provides a ternary superlattice structure comprising a substrate and non-changing periodic layer structure on the substrate and comprising alternating infrared absorbing semiconductor materials comprising a first layer of InAs$_{[1-x]}$Sb$_{[x]}$ ternary alloy material, and a second layer of In$_{[1-y]}$Z$_{[y]}$As ternary alloy material, wherein Z is Ga or Al, wherein x is in a range of greater than zero and less than one, wherein y is in a range of greater than zero and less than one, and wherein a thickness of each of the first and second layers are substantially similar and configured to absorb light in a predetermined spectral band and prevent trapping of carriers in any particular layer. In an example, y is in a range from about 0.05 to about 0.35. In an example, x is in a range of about 0.2 to about 0.8. The first layer of InAs$_{[1-x]}$Sb$_{[x]}$ ternary alloy material may comprise at least one monolayer to about 30 monolayers. The second layer of In$_{[1-y]}$Z$_{[y]}$As ternary alloy materials may comprise at least one monolayer to about 30 monolayers. The first layer of InAs$_{[1-x]}$Sb$_{[x]}$ ternary alloy material may comprise at least one monolayer to about 20 monolayers. The second layer of In$_{[1-y]}$Z$_{[y]}$As ternary alloy materials may comprise at least one monolayer to about 20 monolayers. A total of the InAs$_{[1-x]}$Sb$_{[x]}$ ternary alloy material monolayers and the In$_{[1-y]}$Z$_{[y]}$As ternary alloy material monolayers may be less than 30. The periodic layer structure may comprise bound holes and unbound electrons whose ground state is at most 10 meV below a highest conduction band minimum. A thickness of the periodic layer structure may be configured based on a predetermined selection of an amount of infrared absorption within the periodic layer structure.

Another embodiment provides a method of forming a ternary superlattice structure, the method comprising heating a substrate to a temperature of about 395° C. to about 460° C. in an ultrahigh vacuum ranging from about 10$^{-8}$ to 10$^{-10}$ Torr in base pressure; depositing at least one monolayer to about 30 monolayers of In$_{[1-y]}$Z$_{[y]}$As to form a first semiconductor layer of In$_{[1-y]}$Z$_{[y]}$As ternary alloy material on the substrate, wherein Z is selected from the group comprising of Ga and Al; and depositing at least about one monolayer to about 30 monolayers of InAs$_{[1-x]}$Sb$_{[x]}$ to form a second semiconductor layer of InAs$_{[1-x]}$Sb$_{[x]}$ ternary alloy material on the substrate, wherein x is in a range from greater than zero and less than 1, and y is in a range from greater than zero and less than 1, and wherein a thickness of the first and second semiconductor layers are substantially similar and configured to absorb light in a predetermined spectral band and prevent trapping of electrons in any particular layer.

In an example, y is in a range from about 0.05 to about 0.35. In an example, x is in a range from about 0.2 to about 0.8. The rate of deposition to form either the first semiconductor layer of In$_{[1-y]}$Z$_{[y]}$As ternary alloy material or the second semiconductor layer of InAs$_{[1-x]}$Sb$_{[x]}$ ternary alloy material may be in a range from about 0.4 monolayers per second to about 1.5 monolayers per second. The first semiconductor layer of In$_{[1-y]}$Z$_{[y]}$As ternary alloy material may comprise between about 1 to about 20 In$_{[1-y]}$Z$_{[y]}$As monolayers, and the second semiconductor layer of $InAs_{[1-x]}Sb_{[x]}$ ternary alloy material may comprise between about 1 to about 20 $InAs_{[1-x]}Sb_{[x]}$ monolayers, wherein a sum of the $In_{[1-y]}Z_{[y]}As$ monolayers and the $InAs_{[1-x]}Sb_{[x]}$ monolayers may be about 30 or less.

The method may comprise providing a flux of arsenic (As) and indium (In) species onto a surface of the first semiconductor layer of $In_{[1-y]}Z_{[y]}As$, wherein the flux of arsenic (As) species provides an over-pressure of arsenic sufficient to suppress any evaporation of arsenic from the ternary superlattice structure; adjusting between the depositing steps for the first and second semiconductor layers of $In_{[1-y]}Z_{[y]}As$ and $InAs_{[1-x]}Sb_{[x]}$, wherein the arsenic and antimony fluxes are changed; providing a flux of antimony (Sb), arsenic (As), and indium (In) species onto a surface of the second semiconductor layer of $InAs_{[1-x]}Sb_{[x]}$, wherein the flux of antimony (Sb) and arsenic (As) species provides an over-pressure sufficient to suppress any evaporation of arsenic and antimony from the ternary superlattice structure; and adjusting between the depositing steps for the first and second semiconductor layers of $In_{[1-y]}Z_{[y]}As$ and $InAs_{[1-x]}Sb_{[x]}$, wherein the arsenic and antimony fluxes are changed.

Another embodiment provides an infrared absorbing detector comprising an infrared absorbing ternary superlattice structure comprising a substrate and alternating semiconductor layers comprising a first layer of $InAs_{[1-x]}Sb_{[x]}$ ternary alloy material, and a second layer of $In_{[1-y]}Z_{[y]}As$ ternary alloy material, wherein Z is Ga or Al, wherein x is in a range of greater than zero and less than one, wherein y is in a range of greater than zero and less than one. The detector further comprises a unipolar barrier layer on a first side of the ternary superlattice structure and configured to permit transport of one type of carriers across the barrier layer, wherein a bandgap of the barrier layer is greater than the bandgap of the ternary superlattice structure; a first contact layer on a second side of the ternary superlattice structure above the substrate; and a second contact layer adjacent to the unipolar barrier layer. In an example, y is in a range from about 0.05 to about 0.35. In an example, x is in a range of about 0.2 to about 0.8.

In an example, the barrier layer may comprise an offset between a conduction band of the ternary superlattice structure and a conduction band of the barrier layer to block a transport of electrons across the barrier layer, wherein valence bands of the ternary superlattice structure, the barrier layer, the first contact layer, and the second contact layer are substantially aligned to allow transport of holes between the ternary superlattice structure, the barrier layer, the first contact layer, and the second contact layer. In another example, the barrier layer may comprise an offset between a valence band of the ternary superlattice structure and a valence band of the barrier layer to block a transport of holes across the barrier layer, wherein conduction bands of the ternary superlattice structure, the barrier layer, the first contact layer, and the second contact layer are substantially aligned to allow transport of electrons between the ternary superlattice structure, the barrier layer, the first contact layer, and the second contact layer. In another example, the barrier layer may comprise a ternary superlattice structure comprising alternating semiconductor layers comprising a first layer of $InAs_{[1-x]}Sb_{[x]}$ ternary alloy material, and a second layer of $In_{[1-y]}Z_{[y]}As$ ternary alloy material, wherein Z is Ga or Al, wherein x is in a range of greater than zero and less than one, and wherein y is in a range of greater than zero and less than one.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 1A is a schematic representation of a ternary superlattice structure grown on a substrate, according to an example.

FIG. 1B is another schematic representation of a ternary superlattice structure grown on a substrate, according to an example.

DETAILED DESCRIPTION OF THE INVENTION

Figure 2:
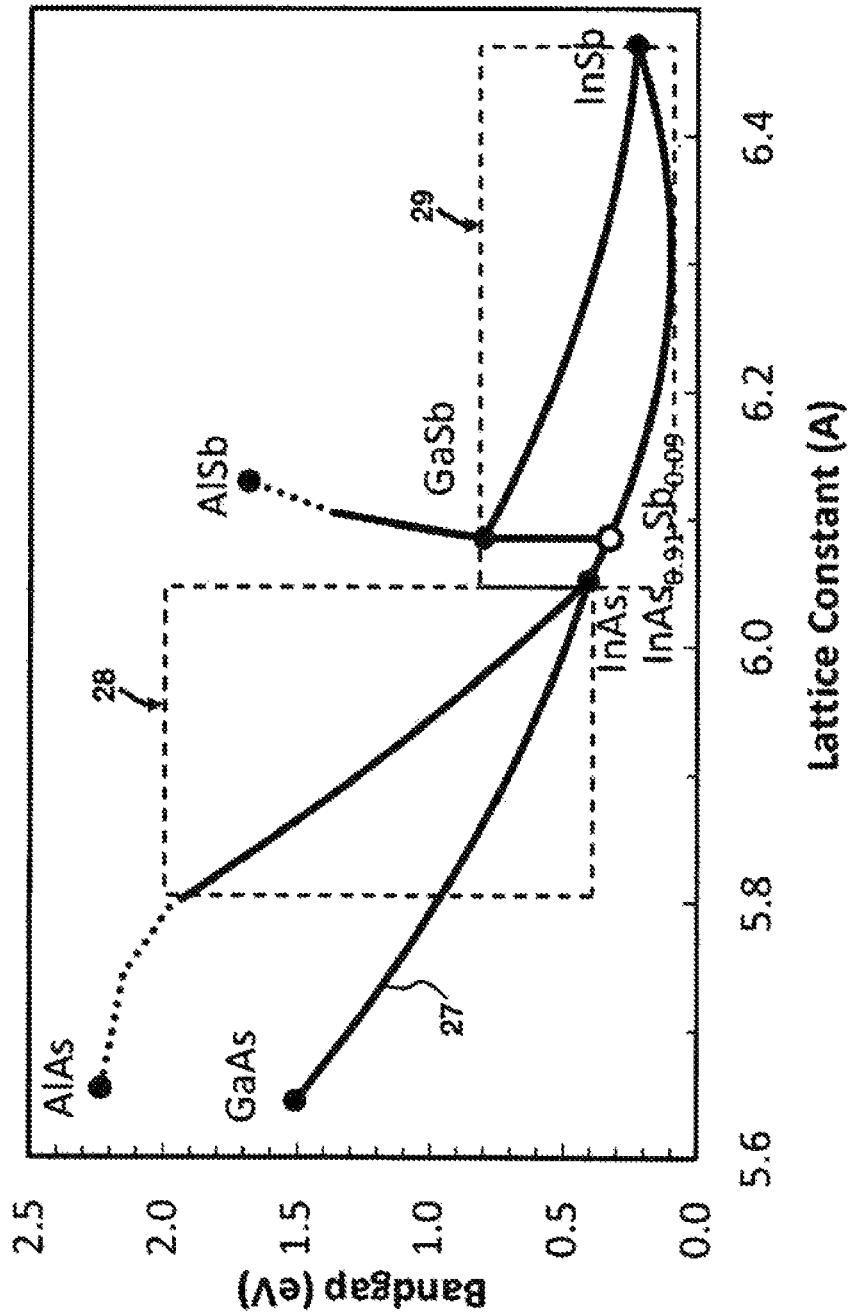
FIG. 2 is a plot of the bandgap (eV) versus lattice constant (A) for exemplary III-V semiconductor base materials and their alloys, according to an example.

Embodiments of the disclosed invention, its various features and the advantageous details thereof, are explained more fully with reference to the non-limiting embodiments that are illustrated in the accompanying drawings and detailed in the following description. Descriptions of well-known components and processing techniques are omitted to not unnecessarily obscure what is being disclosed. Examples may be provided and when so provided are intended merely to facilitate an understanding of the ways in which the claimed invention may be practiced and to further enable those of skill in the art to practice its various embodiments. Accordingly, examples should not be construed as limiting the scope of what is disclosed and otherwise claimed.

It will be understood that when an element or layer is referred to as being "on", "connected to", or "coupled to" another element or layer, it can be directly on, directly connected to, or directly coupled to the other element or layer, or intervening elements or layers may be present. In contrast, when an element or layer is referred to as being "directly on", "directly connected to", or "directly coupled to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future.

Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

As used herein, unless expressly stated otherwise, "operable" refers to able to be used, fit or ready for use or service, usable for a specific purpose, and capable of performing a recited or desired function described herein. In relation to systems and devices, the term "operable" means the system and/or the device is fully functional and calibrated, comprises elements for, and meets applicable operability requirements to perform a recited function when activated.

In the drawings, the size and relative sizes of layers and regions may be exaggerated for clarity. The embodiments herein provide a ternary strained layer superlattice device, infrared detector, and methods of making the same. An infrared absorbing superlattice is defined herein as having an infrared absorbing element that is integrated to form a detector. Referring now to the drawings, and more particularly to FIGS. 1 through 14, where similar reference characters denote corresponding features consistently throughout, there are shown exemplary embodiments.

FIG. 1A illustrates a ternary superlattice structure 10 comprising a substrate 12 and a non-changing periodic layer structure 11 on the substrate 12. In the context of the embodiments herein, "non-changing" refers to a static state of the periodic layer structure 11 in terms of the number of monolayers of the semiconductor materials contained in the periodic layer structure 11 remaining constant. In some examples, the substrate 12 may comprise GaSb (gallium antimonide), InAs (Indium Arsenide), GaAs (Gallium Arsenide), and InP (Indium Phosphide). The non-changing periodic layer structure 11 comprises alternating infrared absorbing semiconductor materials comprising a first layer 14 of $InAs_{[1-x]}Sb_{[x]}$ ternary alloy material and a second layer 16 of $In_{[1-y]}Z_{[y]}As$ ternary alloy material. Furthermore, either layer 14, 16 may be first applied directly to the substrate 12. According to an example, Z is gallium (Ga) or aluminum (Al), wherein the second layer 16 may be $In_{[1-y]}Ga_{[y]}As$ or $In_{[1-y]}Al_{[y]}As$. The ternary alloy materials in the first and second layers 14, 16 are defined by their alloy fractions, x and y, respectively. In various examples x is in the range of greater than zero and less than one, and y is in the range of greater than zero and less than one. The thickness of each of the first and second layers 14, 16 are substantially similar and, in one example, are configured to absorb light in a predetermined spectral band to increase an absorption coefficient, and to increase an electron and hole mobility through the periodic layer structure 11 and prevent trapping of carriers in any particular layer 14, 16. More particularly, the thickness of the periodic layer structure 11 may be configured based on a predetermined selection of an amount of infrared absorption within the periodic layer structure 11. Moreover, the thickness of each layer 14, 16 in the ternary superlattice structure 10, which may be in the range of approximately 1 to 10 nanometers, depends on the desired optical and electrical properties and growth feasibility of the periodic layer structure 11.

In an example, x is in the range of about 0.2 to about 0.8. In an example, y is in the range from about 0.05 to about 0.35. In another example, y is in the range from about 0.05 to about 0.5, and in another example, y is in the range from about 0.05 to about 0.8. In one example, the first layer 14 of $InAs_{[1-x]}Sb_{[x]}$ ternary alloy material may comprise at least one monolayer to about 30 monolayers. In another example, the second layer 16 of $In_{[1-y]}Z_{[y]}As$ ternary alloy materials may comprise at least one monolayer to about 30 monolayers. In yet another example, the first layer 14 of $InAs_{[1-x]}Sb_{[x]}$ ternary alloy material may comprise at least one monolayer to about 20 monolayers. In still another example, the second layer 16 of $In_{[1-y]}Z_{[y]}As$ ternary alloy materials may comprise at least one monolayer to about 20 monolayers.

The total of the $InAs_{[1-x]}Sb_{[x]}$ ternary alloy material monolayers and the $In_{[1-y]}Z_{[y]}As$ ternary alloy material monolayers may be less than 30. The periodic layer structure 11 may comprise bound holes and unbound electrons whose ground state is at most 10 meV below a highest conduction band minimum. The maximum allowed strain, desired bandgap, desired band alignment between conduction bands or valence bands of the layers 14, 16, desired location for the conduction and valence bands of the superlattice structure 10, optical properties such as absorption coefficient, and electrical properties such as electron and hole mobility may be configured at a predetermined and desired level/degree by changing the thickness of the two layers 14, 16 and the alloy fractions, x and y.

FIG. 1B, with reference to FIG. 1A, illustrates another diagram of the ternary superlattice structure 10. The superlattice structure 10 is formed by a plurality of unit cells 13 grown on the substrate 12 in the direction indicated in FIG. 1B, where each unit cell 13 comprises the first layer 14 of a ternary alloy $InAs_{[1-x]}Sb_{[x]}$ and the second layer 16 of a ternary alloy $In_{[1-y]}Z_{[y]}As$, where Z may be Ga or Al, in various examples. The non-changing periodic layer structure 11, which is grown on the substrate 12, is defined as the period of the superlattice structure 10 is defined as a combined thickness 20 of the two ternary alloy layers 14, 16, and the number of periods (also defined as the number of repeats) of the periodic layer structure 11 determines the total thickness 25 of the superlattice structure 10. While the period of the periodic layer structure 11 is the combined thickness of all the layers in the unit cell 13, the number of periods is determined based on the desired total thickness 25 of the periodic layer structure 11. The thicknesses of the first and second layers 14, 16 and the corresponding alloy fractions are the parameters used for configuring the superlattice structure 10.

At least one layer 14 or 16 in the unit cell 13 may be doped either n-type or p-type to obtain a desired electron or hole concentration for the superlattice structure 10 thereby making the superlattice structure 10 suitable for building detector, and other, devices. The thickness of the layers 14, 16 is determined by the maximum allowed strain of the periodic layer structure 11 grown on the substrate 12. The alloy fractions (x and y) of the layers 14, 16 are varied to configure the conduction and valence bands of the alloy materials in the layers 14, 16 thereby obtaining a specific band alignment between conduction bands or valence bands of the layers 14, 16. Accordingly, the thickness 20 and the alloy fractions (x and y) of the layers 14, 16 may be varied to obtain desired locations of the conduction and valence bands in the periodic layer structure 11. Moreover, the thickness 20 and the alloy fractions (x and y) of the layers 14, 16 may be varied to engineer the quantum mechanical properties of the electrons and holes in the periodic layer structure 11 thereby obtaining a maximum overlap of the electron and hole wavefunctions. Furthermore, the thickness 20 and the alloy fractions (x and y) of the layers 14, 16 may be varied to configure the quantum mechanical properties of the electrons and holes in the periodic layer structure 11 thereby maximizing the absorption coefficient therein. The total thickness 25 of the periodic layer structure 11 may be determined based on the desired amount of infrared absorption in the periodic layer structure 11. Additionally, the thickness 20 and the alloy fractions (x and y) of the layers 14, 16 may be varied to configure the electronic bands of the periodic layer structure 11 to be sensitive by absorbing infrared radiation in any wavelength band. Also, the thickness 20 and the alloy fractions (x and y) of the layers 14, 16 may be varied to configure the electronic band of the periodic layer structure 11 to obtain the desired electron and hole effective mass of the periodic layer structure 11. Further, the thickness 20 and the alloy fractions (x and y) of the layers 14, 16 may be varied to configure the electronic band of the periodic layer structure 11 to increase the electron and hole mobility in the periodic layer structure 11, and thereby improving the sensitivity and carrier transport in the superlattice structure 10. In an example, the layers 14, 16 in the unit cell 13 have their conduction bands aligned, closely aligned, or lined up to yield a type-I band alignment thereby introducing spatially direct optical transitions through excitation of carriers from the valence band to the conduction band of the superlattice structure 10.

FIG. 2, with reference to FIGS. 1A and 1B, illustrates the bandgap and lattice constant for the Group III-V semiconductors, which are suitable for use in the superlattice structure 10. The solid circles represent the binary semiconductors and the lines represent the ternary alloys of the two binary semiconductors connected by each line. For an example, the line 27 connecting GaAs and InAs represents the ternary alloys of GaAs and InAs, which are presented as $In_{[1-y]}Ga_{[y]}As$. Here, y is the alloy fraction which varies from greater than zero to less than 1. For comparison, the outlined area 29 represents the material space for conventional binary $InAs/InAs_{[1-x]}Sb_{[x]}$ superlattice structures, while the outlined area 28 shows the extended space for the superlattice structure 10 provided by the embodiments herein.

In developing a superlattice structure, such as the superlattice structure 10 provided by the embodiments herein, the alignment of the conduction and valence bands of two constituent materials, such as $In_{[1-y]}Ga_{[y]}As$ and $InAs_{[1-x]}Sb_{[x]}$, play a critical role. The alloy fractions (x and y) may be adjusted so that the conduction bands of the two constituent materials are aligned. This is one aspect of the embodiments herein which is different than conventional $InAs/InAs_{[1-x]}Sb_{[x]}$ superlattice structures, and it results in performance enhancement of the superlattice structure 10. For example, for x=0.35 and y=0.2, the favorable condition for ternary superlattice structures under which only the holes are confined, may be achieved. This leads to an increased electron-hole wavefunction overlap causing an increased absorption coefficient, a parameter that characterizes the absorption properties. Furthermore, a reduction in hole effective mass may also be predicted for the ternary superlattice structure 10 provided by the embodiments herein due to the broadening of its hole bands. This increases the hole mobility (and the diffusion length of n-type ternary superlattice structures) which is highly desired for enhancing performance of the devices that utilize ternary superlattice structure. While ternary superlattice structures may be employed in a broader wavelength spectrum covering short-wave infrared (SWIR: 0.7-2.5 µm), mid-wave infrared (3-5 µm), and long-wave infrared (8-14 µm) bands, they are highly suitable for the MWIR band.

Figure 3:
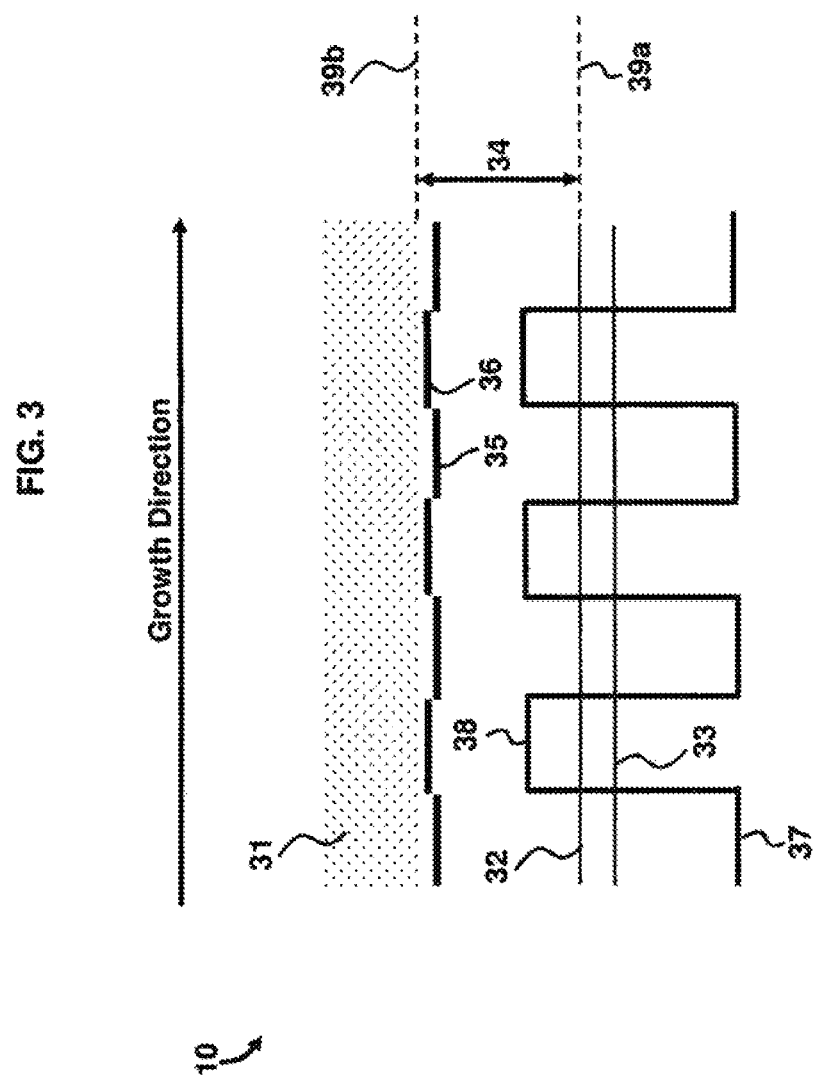
FIG. 3 is a schematic representation showing band diagrams of an exemplary InGaAs/InAsSb ternary superlattice structure illustrating the conduction and valence bands of bulk layers and the conduction and valence minibands of the superlattice, according to an example.

Although superlattice structures are made out of semiconductor materials, once they are properly designed, superlattice structures, in general, are treated as new artificial semiconductors and are characterized by their parameters such as bandgap and electron and hole effective masses. The superlattice structure 10 may also be represented by its conduction-valence band profile, commonly known as the band diagram. FIG. 3, with reference to FIGS. 1A through 2, illustrates the band diagram for an InGaAs/InAsSb ternary superlattice structure 10.

In general, electrons and holes in the superlattice structure 10 are confined and, as a result, the formation of quantized energy states (or minibands) occurs. As shown in FIG. 3, the band diagram includes an electron mini-band 31, heavy hole-like mini-band 32, and light hole-like mini-band 33. The bandgap 34 of the superlattice structure 10 is defined as the energy gap between the electron mini-bands 31 and the heavy hole-like mini-bands 32. The bandgap 34 has a valence band edge 39a and a conduction band edge 39b. The bandgap 34 determines the longest wavelength of light that can be absorbed by the superlattice structure 10 and it can be tuned by changing the configuration of the superlattice structure 10. The valence band profile 37 of the InGaAs material and the valance band profile 38 of the InAsSb material are also shown in the band diagram. A distinctive difference between InAs/InAsSb superlattice structures and InGaAs/InAsSb ternary superlattice structures is how the bulk layer conduction band profile varies across the superlattice structure 10. The InGaAs/InAsSb ternary superlattice structure 10 has a fairly constant conduction band profile 35, 36, while InAs/InAsSb superlattice structures have a discontinuity in the conduction band across the superlattice. Due to this specific conduction band profile 35, 36 in the ternary superlattice structure 10, the absorption coefficient can be significantly enhanced.

The thickness 20 of the layers 14, 16 (e.g., the period) is one parameter controlling most of the desired band structure parameters and material properties. While the alloy composition, x and y, of the layers 14, 16 are determined to achieve the required conduction band profile 35, 36 and valence band profile 37, 38, the thickness of the layers 14, 16 may be adjusted to balance the strain of the superlattice structure 10, obtain the required bandgap 34 for the desired wavelength band, hole effective mass of the heavy-hole like mini-bands 32, hole mobility, and the position of the hole mini-bands 32, 33. When the thickness of the layers 14, 16 decreases/increases, the hole mini-bands 32, 33 move down/up, respectively, which effectively increases/decreases, respectively, the bandgap 34. The alloy composition, x and y, of the layers 14, 16 can be iteratively tuned to further adjust the bandgap 34 and strain, however, the thickness 20 of the layers 14, 16 is used to enhance the material properties such as absorption coefficient and the carrier mobility. Decreasing the thickness 20 of the layers 14, 16 also increases the overlap between the electron and hole wavefunctions, enhancing the absorption properties of the superlattice 10 characterized by the absorption coefficient. In addition, reducing the thickness 20 of layers 14, 16 broadens the hole mini-bands 32, 33 causing a reduction of the hole effective mass, which in turn increases the hole mobility.

Figure 4:
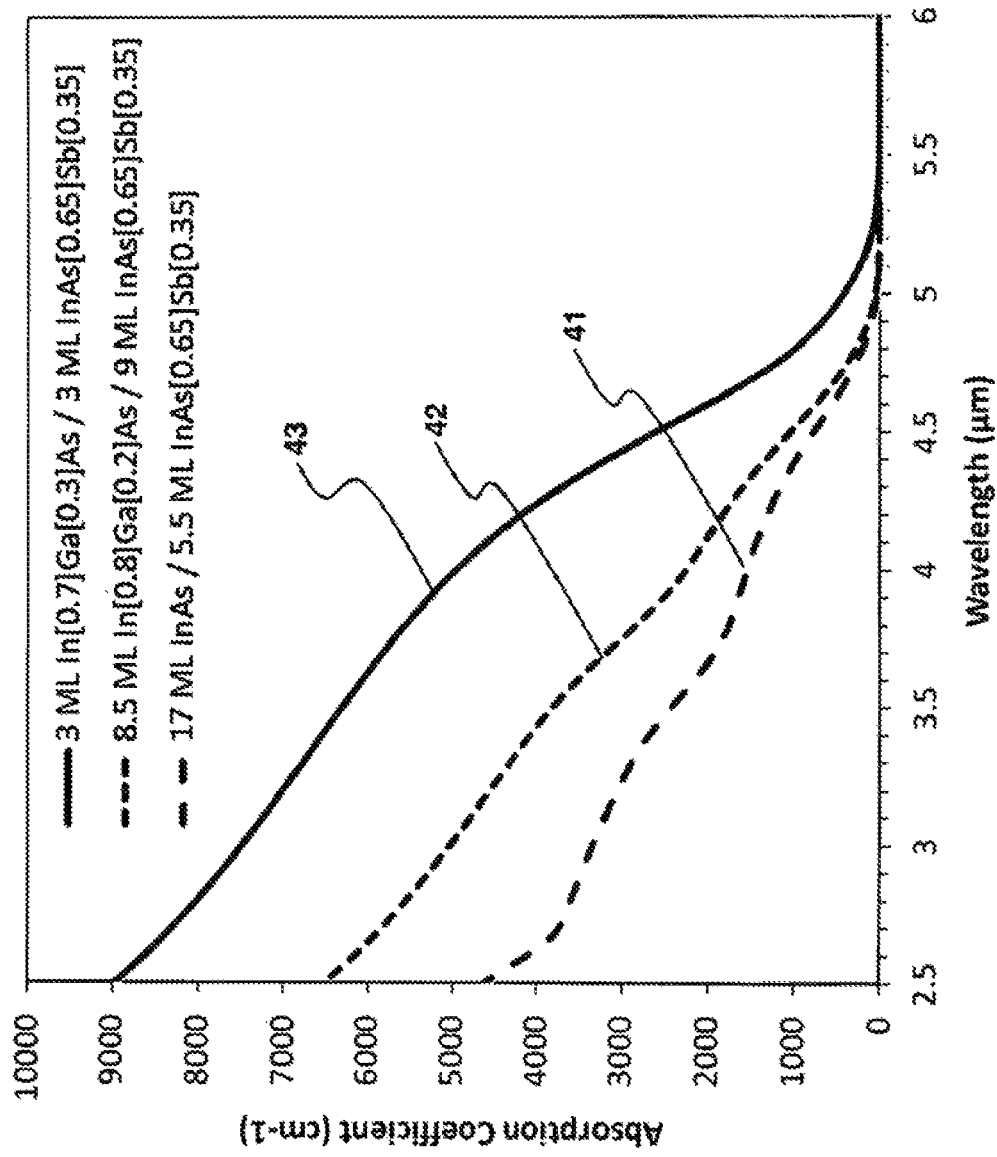
FIG. 4 is a graphical illustration of the absorption coefficient ($cm^1$) versus wavelength (m) for a calculated absorption coefficient at 80K for two InGaAs/InAsSb ternary superlattice structures compared against an InAs/InAsSb superlattice structure, showing a significant improvement in the absorption coefficient for the InGaAs/InAsSb ternary superlattice structures compared to the InAs/InAsSb superlattice structure, according to an example.

The calculated absorption coefficient at 80 K for three example superlattice structures are shown in FIG. 4, with reference to FIGS. 1A through 3. The superlattice structure exhibiting the lowest absorption coefficient spectrum 41 is a conventional InAs/InAsSb superlattice structure (17 ML InAs/5.5 ML InAs[0.65]Sb[0.35]), while the other two are ternary superlattice structures: 8.5 ML In[0.8]Ga[0.2]As/9 ML InAs[0.65]Sb[0.35] structure 42 and 3ML In[0.7]Ga[0.3]As/3 ML InAs[0.65]Sb[0.35] structure 43. Both ternary superlattice structures 42, 43 show significant enhancement in absorption properties and the ternary superlattice structure 43 with 30% gallium shows more than a factor of two enhancement in the 3-5 µm band. This enhancement in the absorption coefficient directly impacts the quantum efficiency of the detectors utilizing these ternary superlattice structures 42, 43 as the infrared absorbing material. Band structure calculations also revealed that the optical transitions in the superlattice structure 43 is especially direct and the alignment of the conduction band profile 35, 36 is no longer a Type II band alignment.

In InGaAs/InAsSb ternary superlattice structures, the gallium composition can be used for "balancing" the strain in the superlattice structure in addition to typical layer thickness balancing performed in binary material systems. This greater flexibility in strain compensation allows for the ternary superlattice structure 10 to contain thin layers 14, 16 instead of having relatively thick layered strain balancing layer(s) as in the conventional structures. When the layers 14, 16 in the unit cell 13 are thin (e.g., about 5 to about 20 monolayers each), the broadening of the electron and hole wavefunctions increase resulting in reduction in the electron and hole effective masses. Based on band structure calculations for three example $In_{[1-y]}Ga_{[y]}As/InAs_{[0.65]}Sb_{[0.35]}$ superlattice structures with y=0, 0.05, 0.1, 0.2, and 0.3 show that the hole effective mass decreases with increasing gallium composition in the $In_{[1-y]}Ga_{[y]}As$ layers (e.g., second layer 16). The calculated values of the hole effective mass are 2.97, 2.98, 2.14, 1.49, and 0.16 for y=0, 0.05, 0.1, 0.2, and 0.3, respectively. This reduction in hole effective mass for ternary superlattice structures is a predominant advantage as it relates to the hole mobility. With y=0, 0.05, and 0.2, the hole mobility for the ternary superlattice structures with y=0.2 is about an order of magnitude higher than the conventional InAs/InAsSb superlattice structure (y=0). This increase in hole mobility leads to an increase in the minority hole diffusion length in n-type superlattice structures employed in barrier detector structures such as nBn.

Similar to the $In_{[1-y]}Ga_{[y]}As/InAs_{[1-x]}Sb_{[x]}$ superlattice structures, which are primarily suited for infrared absorbers, $In_{[1-y]}Al_{[y]}As$ and $InAs_{[1-x]}Sb_{[x]}$ can also be designed. While the $In_{[1-y]}Al_{[y]}As$ and $InAs_{[1-x]}Sb_{[x]}$ ternary superlattice structures can also be used as infrared absorbers, they are particularly suitable for hole blocking barriers due to the possibility of wider bandgap compared to InGaAs/InAsSb ternary superlattice structures. For an example, a 4ML In[0.9]Al[0.1]As/3 ML InAs[0.62]Sb[0.38] ternary superlattice structure has a bandgap of 374 meV and its conduction band location is well within the acceptable range to align with the conduction band of the InGaAs/InAsSb ternary superlattice structure absorbers. Similarly, a 9 ML In[0.9]Al[0.1]As/3 ML In[0.5]Al[0.5]Sb ternary superlattice structure has a bandgap of 571 meV and it is suitable for a hole blocking barrier of pBp MWIR structures with p-type InGaAs/InAsSb ternary superlattice structures.

Figure 5:
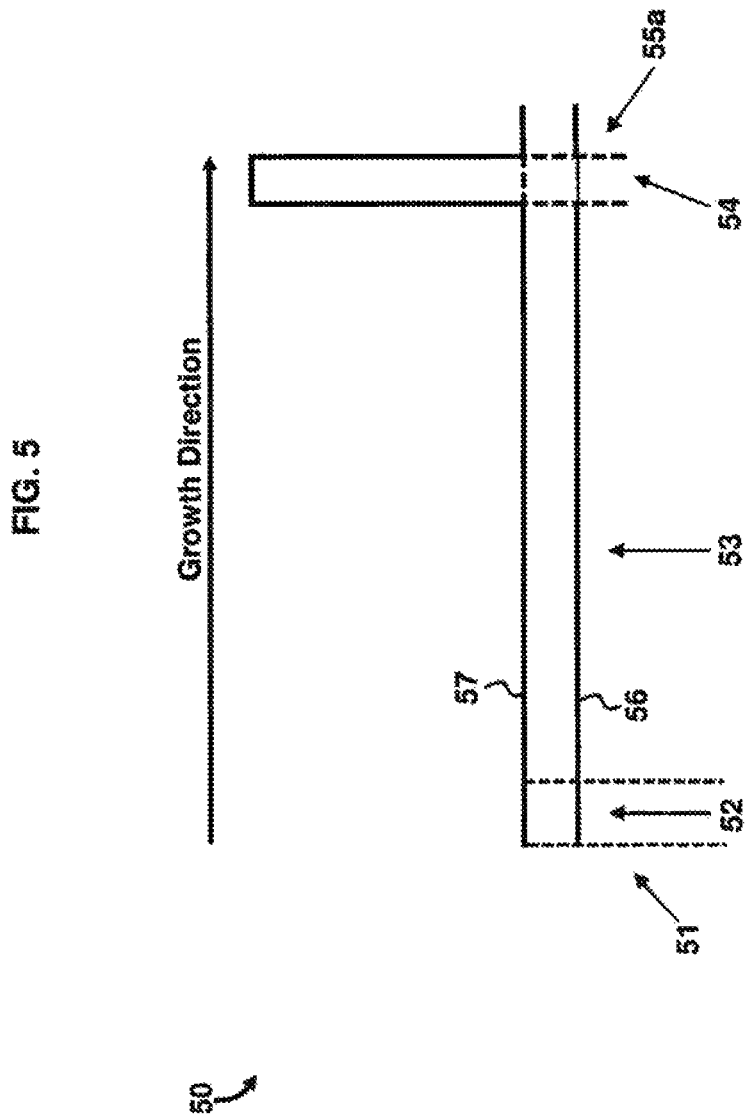
FIG. 5 is an illustration showing the conduction and valence band profile of an nBn detector structures comprising of n-type InGaAs/InAsSb ternary superlattice structures serving as bottom contact and infrared absorbing layers, a bulk AlGaAsSb quaternary layer serving as the barrier, and another n-type doped ternary superlattice structure layer serving as the top contact layer, according to an example.

FIG. 5, with reference to FIGS. 1A through 4, shows the band diagram of an nBn barrier infrared detector 50 grown on a substrate 51 and comprising of, from bottom to top, a thin n-type doped ternary superlattice as the bottom contact layer 52, a thick n-type doped ternary superlattice absorber 53, an electron barrier layer 54, and another thin n-type ternary superlattice as the top contact 55a. For proper operation, the superlattices are designed such that their valence bands 56 of all the layers exhibit a reasonable band alignment.

Figure 6:
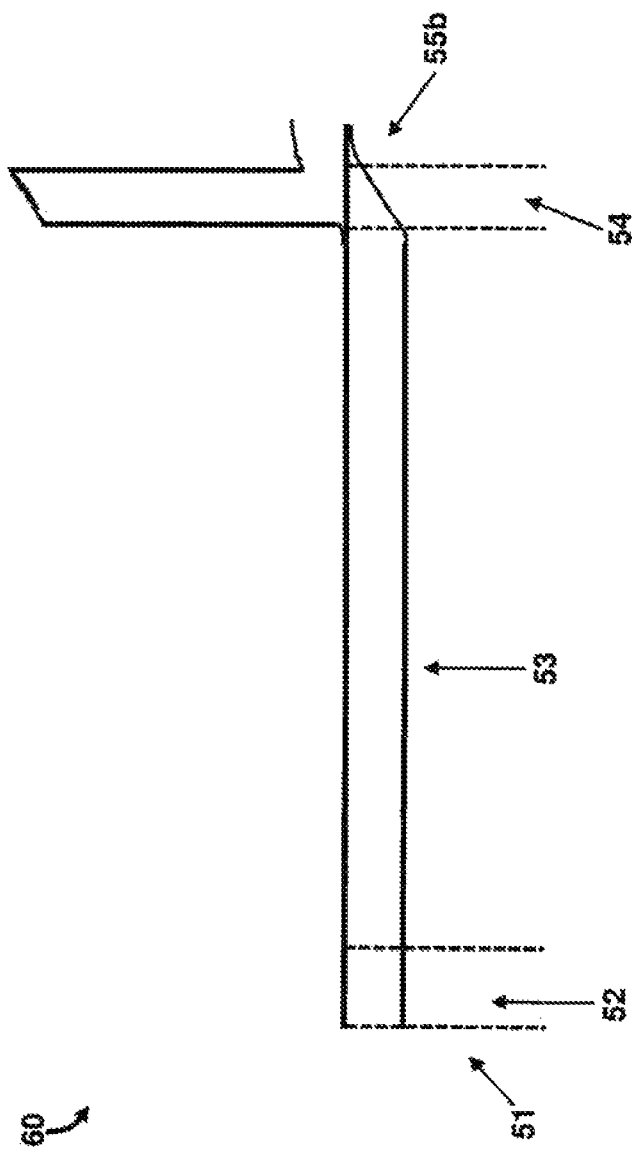
FIG. 6 is an illustration showing the conduction and valence band profile of an nBp detector structures comprising of n-type InGaAs/InAsSb ternary superlattice structures serving as bottom contact and infrared absorbing layers, a bulk AlGaAsSb quaternary layer serving as the barrier, and a p-type doped ternary superlattice structure layer serving as the top contact layer, according to an example.

Similarly, as shown in FIG. 6, with reference to FIGS. 1A through 5, the top contact superlattice 55b can be doped p-type to form a heterojunction nBp photodiode device 60. These devices 50, 60 are operated as minority carrier devices and the dark and photo current depend on three basic material properties: minority carrier lifetime, mobility, and absorption coefficient. In a conventional n-type superlattice structure absorber, the mobility of the monitory holes is low, thus the diffusion length remains short. Consequently, the detector's active layer thickness is limited by the diffusion length. Using a ternary superlattice structure 10 as provided by the embodiments herein achieves: (i) a higher absorption coefficient, which increases the absorption, and (ii) a higher hole mobility, which increases the carrier collection efficiency also allowing increasing the absorber thickness.

Figure 7:
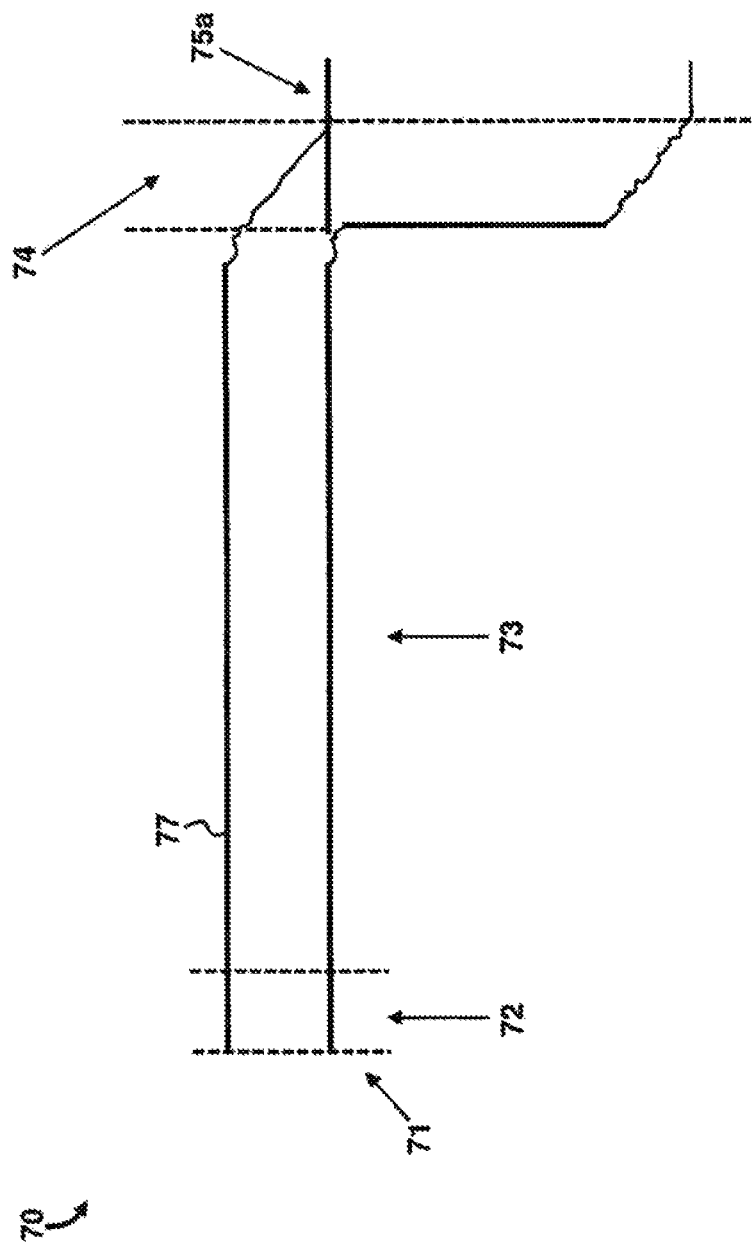
FIG. 7 is an illustration showing the conduction and valence band profile of a heterojunction pN diode structures comprising of p-type InGaAs/InAsSb ternary superlattice structures serving as bottom contact and infrared absorbing layers, and wider bandgap undoped and n-type doped InAlAs/InAsSb ternary superlattice structures serving as the hole blocking barrier and the top contact layer, respectively, according to an example.
Figure 8:
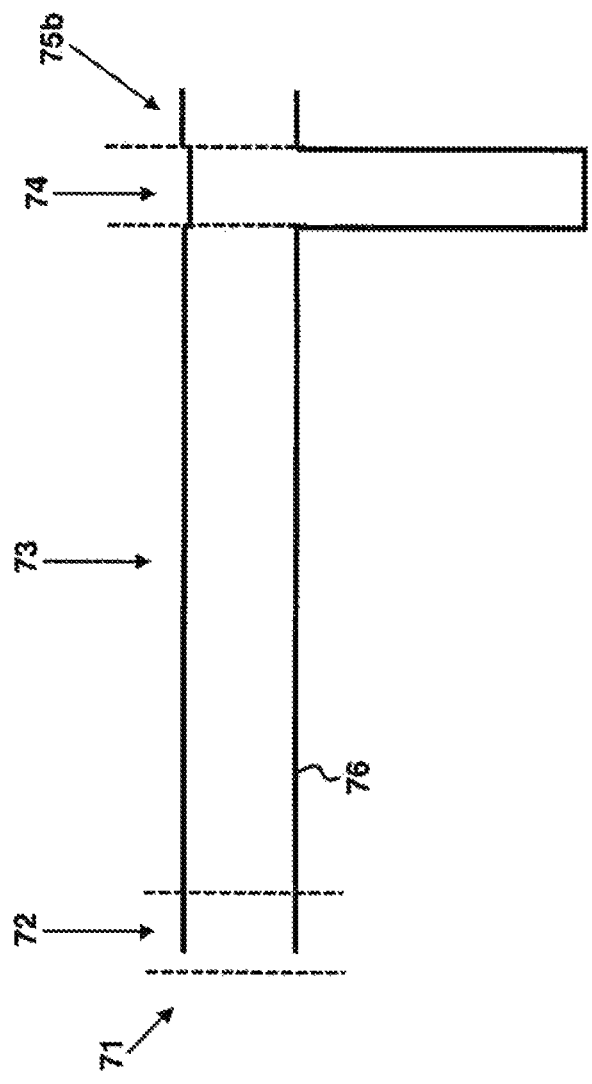
FIG. 8 is an illustration showing the conduction and valence band profile of a pBp structures comprising of p-type InGaAs/InAsSb ternary superlattice structures serving as bottom contact and infrared absorbing layers, a wider bandgap undoped InAlAs/InAsSb ternary superlattice structure serving as the hole blocking barrier, and an n-type InGaAs/InAsSb ternary superlattice structure serving as the top contact layer, according to an example.

The ternary superlattice structure hole barriers provide some additional detector designs utilizing p-type absorbers. In p-type absorbers, the minority carriers are electrons and the electron diffusion length is a few orders of magnitude higher than the hole mobility. FIG. 7, with reference to FIGS. 1A through 6, shows the band diagram of apN heterojunction diode structure 70 grown on a substrate 71 and comprising of, from bottom to top, a thin p-type doped ternary superlattice as the bottom contact layer 72, a thick p-type doped ternary superlattice absorber 73, a thin wide bandgap undoped ternary superlattice as the hole blocking barrier 74, and a thin n-type ternary superlattice 75a as the top contact. Here, the ternary superlattice structure 70 is configured to obtain a reasonable conduction band alignment 77. The InGaAs/InAsSb ternary superlattice structure 70 exhibits its conduction band 77 at a relatively higher location compared to that of conventional InAs/InAsSb superlattice structures. This opens up the possibility of designing hole blocking barriers with wider bandgaps. As discussed above, InAlAs/InAsSb and InAlAs/InAlSb superlattice structures are two possible hole blocking barriers suitable for ternary superlattice structure detectors. Similarly, as shown in FIG. 8, with reference to FIGS. 1A through 7, a pBp structure 80 can be formed by replacing the top contact 75a of the pN heterojunction diode 70 (of FIG. 7) with a p-type ternary superlattice structure 75b which is same or similar to the absorber 73. Both of these structures 70, 80 utilizing p-type ternary superlattice structures 72, 73 have the advantage of the higher absorption coefficient to increase the quantum efficiency.

Figure 9:
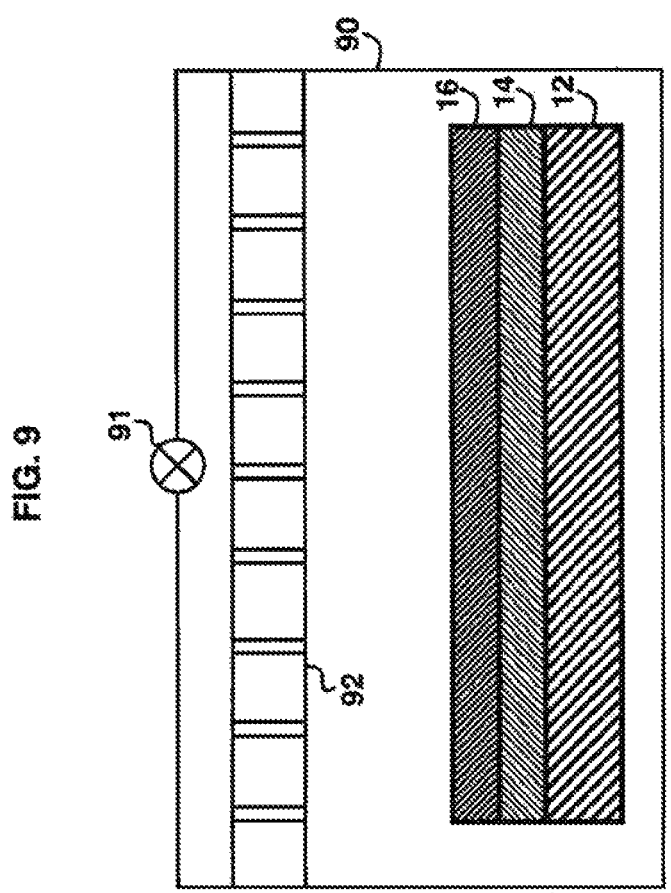
FIG. 9 is a schematic diagram illustrating a system for performing superlattice growth, according to an example.

There are two known methods suitable for making the ternary superlattice structure 10, i.e., molecular beam epitaxy (MBE) and metal-organic vapor phase epitaxy (MOVPE). For example, the MBE process begins by inserting a substrate 12 (e.g., GaSb or InAs) into a deposition system 90, as shown in FIG. 9, with reference to FIGS. 1A through 8. After removing the surface oxide, the substrate 12 is heated to about 350° C. to about 500° C. and deposition commences. The atomic flux of the InGaAs layer (e.g., second layer 16) is carefully calibrated to minimize the amount of excess arsenic in the system (e.g., there is no more than about 50% more arsenic than required to maintain stoichiometric conditions in the InGaAs), and the atomic flux of the InAsSb layer (e.g., first layer 14) uses an arsenic flux that is sub-stoichiometric. The ratio of gallium to indium is controlled by the temperature of the effusion cells, and the ratio of arsenic to antimony is controlled by the position of the source valve 91. Switching between each compound (e.g., InGaAs and InAsSb) is performed using a system of shutters 92, although one of the major aspects of the ternary superlattice structure 10 provided by the embodiments herein is the ability to leave open the arsenic and indium shutters 92 for the entire duration of the deposition. The deposition may occur at the rate of about 0.4 to about 1.0 monolayers per second via MBE, or about 1.2 to about 3 angstroms per second.

The main difference between the two deposition processes (MBE and MOVPE) is the use of mass flow controllers (not shown) in MOVPE as opposed to valves and shutters in MBE. MOVPE also use metalorganic precursors (i.e., tertiarybutylarsine (TBA), Arsine, TMSb, TESb, TMGa, etc.) and typically operates at higher substrate temperatures and growth rates.

The ternary superlattice structure 10 has been tested experimentally. The samples described below as well as the experimental procedures, test equipment, and materials are examples only, and the embodiments herein are not restricted to these particular samples. Three nBn detector structures that utilize $In_{1-y}Ga_yAs/InAs_{0.65}Sb_{0.35}$ superlattice structures serving as n-type regions and an AlGaAsSb quaternary layer serving as the barrier were experimentally designed. All the detector structures are the same, except for the superlattice structure configuration. The $In_{1-y}Ga_yAs/InAs_{0.65}Sb_{0.35}$ superlattice structures were configured to exhibit the same bandgap and the three ternary superlattice structure configurations have an approximate gallium fraction, y=0, 0.05, and 0.2. Descriptions of each of the samples are described in Table I.

TABLE I

Experimental Sample parameters of 500 nm thick $In_{1-y}Ga_yAs/InAs_{0.65}Sb_{0.35}$ superlattice structures

| Gallium fraction (%) | $In_{1-y}Ga_yAs$ thickness (Å) | $InAs_{1-x}S_x$ Thickness (Å) | Measured y | Measured x | Number of periods | Measured period (Å) | Measured mismatch (%) | FWHM SL + 1 (arc sec) |
|---|---|---|---|---|---|---|---|---|
| 0 | 51.73 | 16.73 | 0.0000 | 0.3571 | 73 | 66.98 | — | 81 |
| 5 | 39.56 | 19.78 | 0.0536 | 0.3558 | 84 | 57.94 | 0.06 | 53 |
| 20 | 25.86 | 27.38 | 0.1940 | 0.3571 | 94 | 51.35 | — | 74 |

These exemplary superlattice structure samples were grown using a Veeco® Gen 930 solid-source molecular beam epitaxy reactor on n-type GaSb (100) wafers. Standard deoxidation techniques and GaSb buffer growth conditions were used prior to superlattice growth. The indium growth rate of the superlattice was set to 0.5 ML/sec, and the gallium growth rate was adjusted according to the desired composition (i.e. the growth rate of the InGaAs layer increased with gallium composition). The arsenic flux was held constant for all three InGaAs compositions, corresponding to an arsenic to Group III atomic flux ratio of approximately 1.1-1.4. The arsenic flux was decreased slightly for the InAs$_{0.65}$Sb$_{0.35}$ layers in order to promote antimony incorporation. The growth temperature of the superlattice was approximately 405° C., or about 5° C. above the GaSb surface transition temperature. The number of periods was modified in order to maintain a constant 500 nm thick absorbing region. The surface roughness of the samples was checked post-growth, and verified to be less than 0.5 nm for all three samples.

Figure 10:
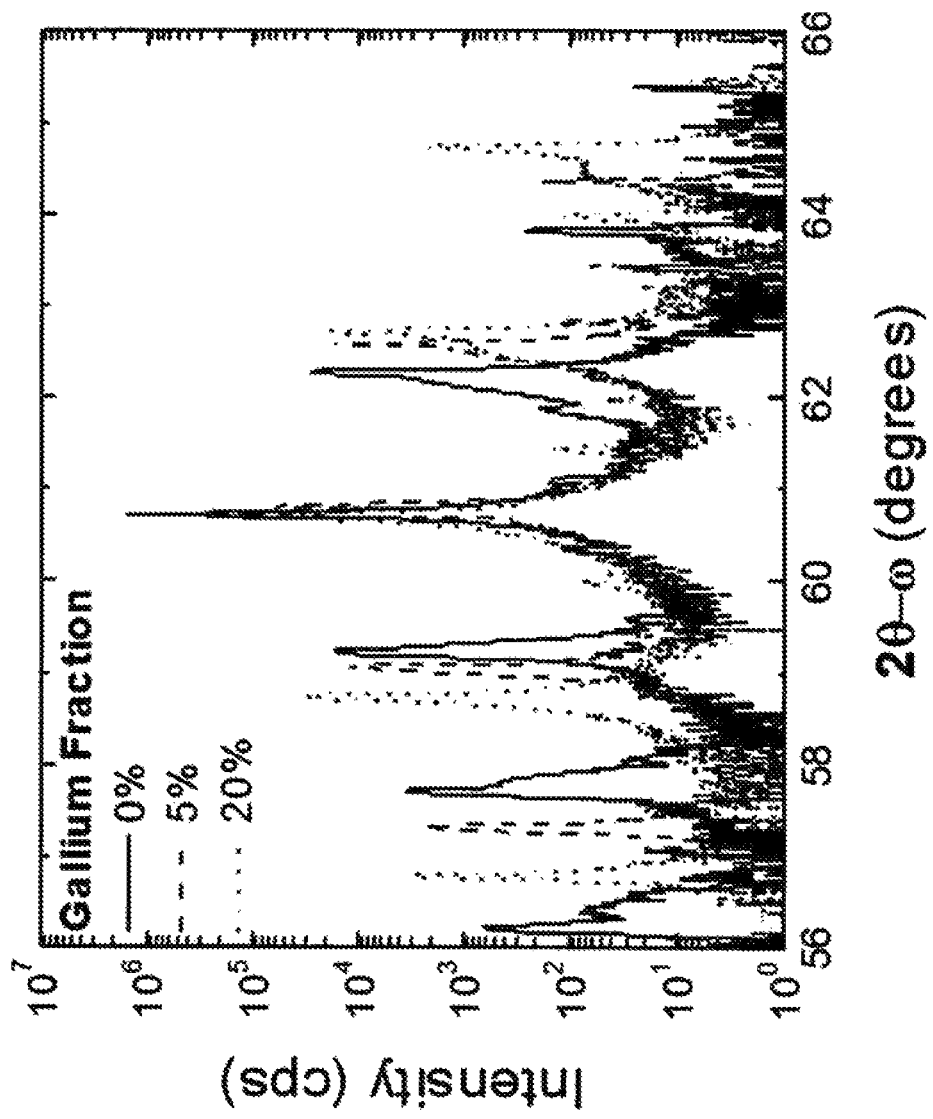
FIG. 10 is an illustration showing (004) X-ray diffraction 2θ-ω scans for three $In_{1-y}Ga_yAs/InAs_{0.65}Sb_{0.35}$ ternary superlattice structures (with y=0, 0.05, and 0.2) grown on a GaSb substrate, according to an example.

X-ray diffraction measurements were performed on a PANalytical® Empyrean® diffractometer with a hybrid monochromator and a triple crystal. The symmetric measurements around the GaSb (004) reciprocal lattice point are shown in FIG. 10, with reference to FIGS. 1A through 9. The measured lattice mismatch for all samples was less than 0.1%, which indicates that it should be possible to grow thick absorbing regions without creating strain-induced defect states. Meanwhile, the full-width-half-maximum (FWHM) values of the SL+1 peaks were 50-85 arcsec, and do not exhibit a clear trend. It is possible that the FWHM decreased as the number of periods increased, and then increased again as the gallium affected growth through either intermixing or crystal quality. Finally, the fringe spacing for all three superlattice structure samples was within 4% of their modeled periodicity, which implies that the modeled absorption/emission values should be valid for each sample.

Figures 11A, 11B:
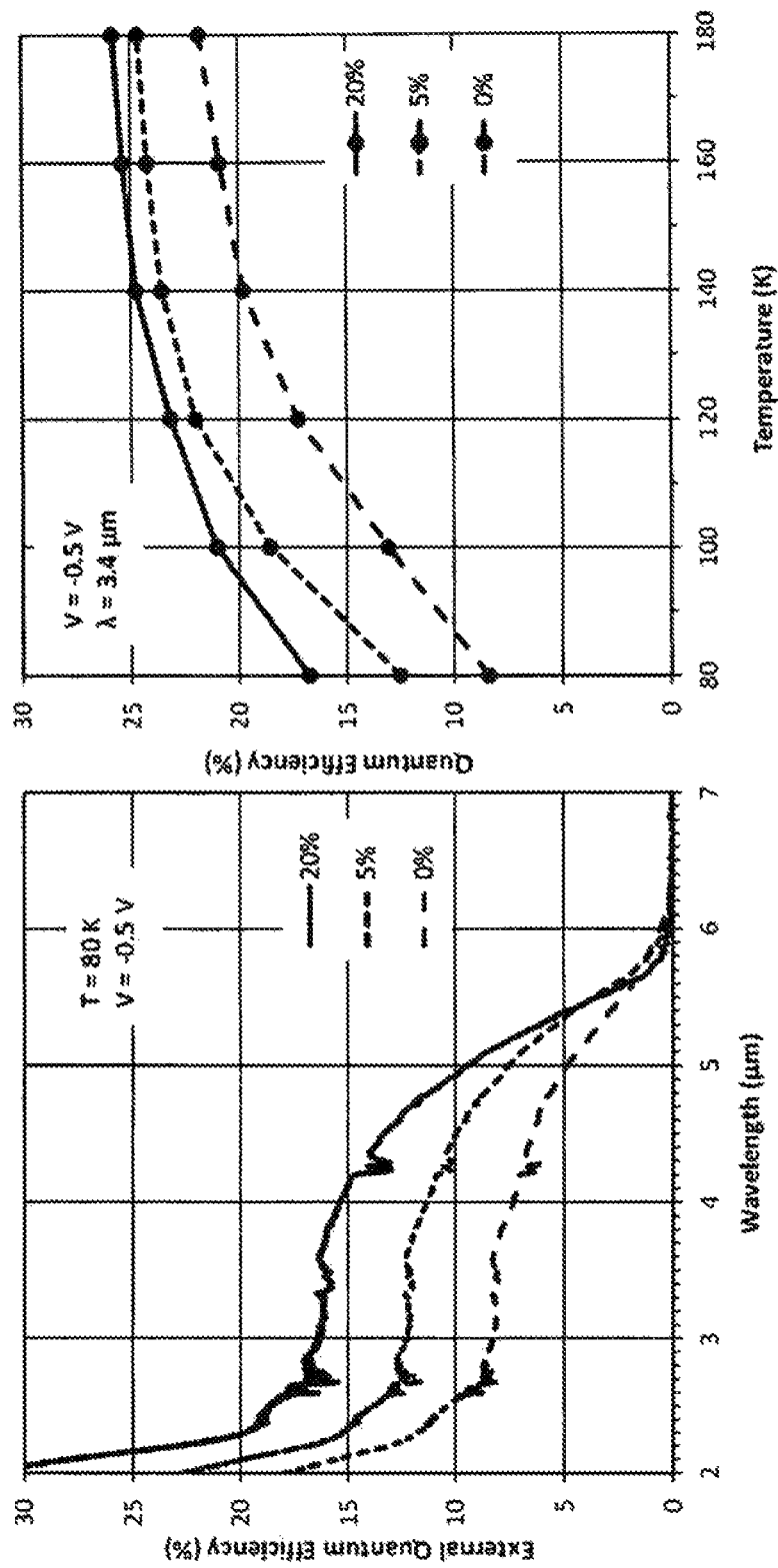
FIG. 11A is a graphical plot of experimentally measured quantum efficiency spectra at ~80 K for three nBn detectors utilizing $In_{[1-y]}Ga_{[y]}As/InAs_{0.65}Sb_{0.35}$ ternary superlattice structures (with y=0, 0.05, and 0.2), according to an example.
FIG. 11B is a graphical plot of quantum efficiency (%) versus temperature (K) showing the dependence of the experimental quantum efficiency on temperature at –0.5 V bias voltage for the three nBn detectors utilizing $In_{[1-y]}Ga_{[y]}As/InAs_{0.65}Sb_{0.35}$ ternary superlattice structures (with y=0, 0.05, and 0.2) used in FIG. 11A, according to an example.

Square mesa single element detectors were fabricated and the spectral photoresponse of the experimental devices were also measured. As shown in FIGS. 11A and 11B, with reference to FIGS. 1A through 10, the increase in the absorption for ternary superlattice structures is clearly observed as the highest quantum efficiency is observed for the sample with 20% gallium composition in the experimental InGaAs/InAsSb superlattice structure. Furthermore, the temperature variation of the quantum efficiency confirms that the increase in quantum efficiency is not due to poor carrier collection, but indeed due to the increase in the absorption.

Figure 12:
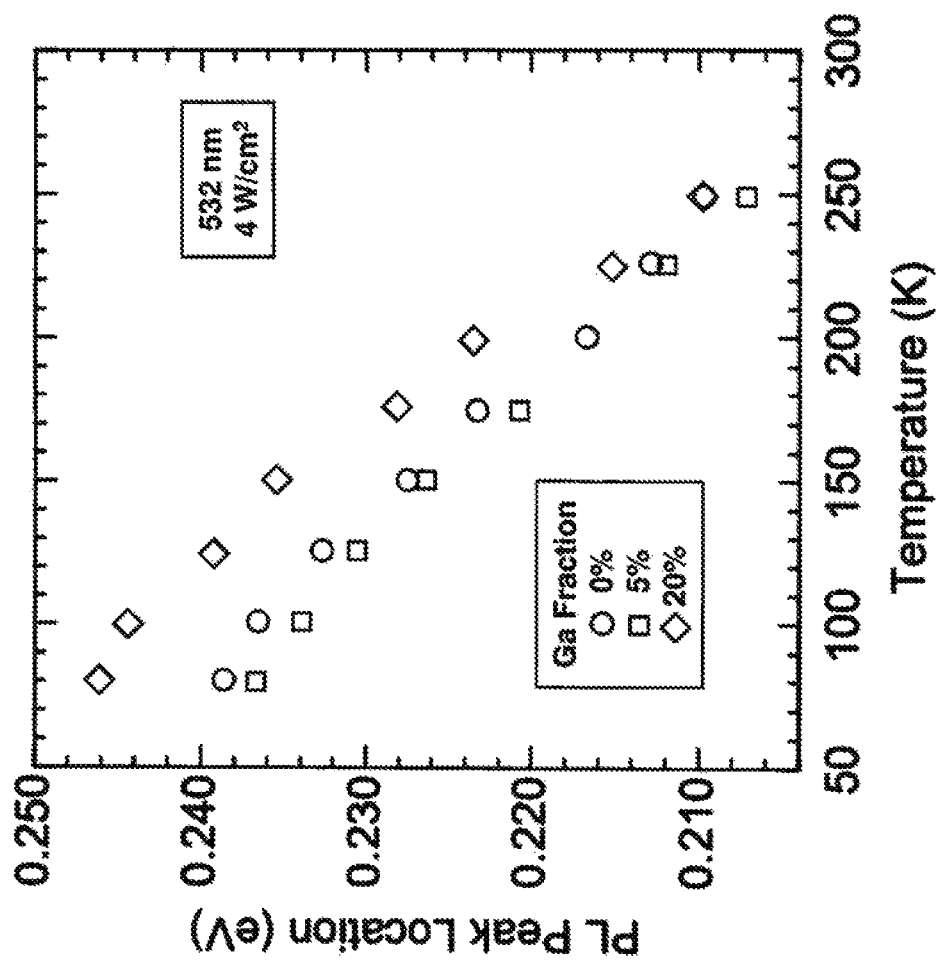
FIG. 12 is a graphical plot showing the photoluminescence peak position (bandgap) versus temperature for three sample ternary superlattice structures with a gallium fraction percentage of 0%, 5%, and 20%, according to an example.

To investigate the optical properties of the sample superlattice structures, photoluminescence (PL) and transmission characterization were conducted. The excitation- and temperature-dependent PL measurements were performed using a 532-nm 2-W Coherent VERDI® laser modulated at 60 kHz, a Bruker® 80V Fourier transform infrared (FTIR) spectrometer, a liquid nitrogen cooled HgCdTe detector with a cutoff at approximately 12 μm, and a closed-cycle helium cryostat capable of maintaining temperatures from 4K to 325 K. PL spectra under low excitation (approximately 4 W/cm$^2$) for each of the samples were generated at 80K and 150 K. The sample without any Ga (InAs/InAs$_{0.65}$Sb$_{0.35}$ superlattice structure) had the highest PL intensity in the set at both temperatures. The PL intensity decreased monotonically with increased Gallium concentration. Several possibilities exist for this trend, including shorter Shockley-Read-Hall lifetimes caused by defects, increased surface recombination caused by enhanced absorption, or increased carrier escape caused by changes in the conduction band alignment and hole effective mass. As shown in FIG. 12, with reference to FIGS. 1A through 11B, the PL peak locations for the three samples at a given temperature stay within 64 meV over a wide range of temperatures. This result confirms the validity of the sample configuration to predict the material bandgap. The FWHM of the spectra at 80K are 3261 meV. At 150 K, the Ga containing superlattice structures have FWHMs of 35 meV while that of the InAs/InAs$_{0.65}$Sb$_{0.35}$ superlattice structure is 5 meV higher. Consistent FWHMs reveal the uniform crystal quality of the entire set of samples, even as additional Ga is added. To determine the bandgap from the PL peak location, ½kT was subtracted, and the resulting bandgaps are shown in Table II for each sample. The measured bandgap according to the PL results is on average 16 meV lower than the calculated (Calc.) bandgap, but the bandgaps are consistent within the set and agree very well with bandgaps determined from absorption (Abs.).

TABLE II

Summary of the results for the bandgap of superlattice structures

| Gallium fraction (%) | 80K bandgap (eV) | | | 150K bandgap (eV) | | |
| --- | --- | --- | --- | --- | --- | --- |
| | Calc. | PL | Abs. | Calc. | PL | Abs. |
| 0 | 0.252 | 0.236 | 0.234 | 0.237 | 0.222 | 0.223 |
| 5 | 0.255 | 0.233 | 0.234 | 0.240 | 0.220 | 0.219 |
| 20 | 0.252 | 0.243 | 0.240 | 0.238 | 0.229 | 0.223 |

In order to obtain the absorption properties of the superlattice structures, IR transmission measurements were performed using a FTIR spectrometer. IR transmission through each sample and their substrates (substrate samples were prepared by etching away the superlattice structures layers) were separately measured at 80K and 150 K. The absorption coefficient of the superlattice structures were obtained by fitting the modeled transmission to the experimentally measured transmission through a regression analysis.

These superlattice structures were designed for 150K operation, which is evidenced by the complete coverage of the 3-5 μm spectral band at 150 K, while at 80 K, the absorption coefficient is virtually negligible at 5 μm. While achieving the same bandgap for different lattice-matched designs is remarkable, the most important observation is the trend of the absorption coefficient variation when the Ga composition in the InGaAs layers is increased.

The sample with no gallium (InAs/InAs$_{0.65}$Sb$_{0.35}$ superlattice structure) has the lowest absorption coefficient, while the sample with the highest Ga fraction (In$_{0.8}$Ga$_{0.2}$As/InAs$_{0.65}$Sb$_{0.35}$) shows the highest absorption coefficient. It is an increase of 30%-35% over the entire 3-5 μm spectral band. This result clearly proves the advantages of the ternary superlattice structures provided by the embodiments herein, especially in increasing the absorption properties. Furthermore, for the InAs/InAs$_{0.65}$Sb$_{0.35}$ sample, the value of the absorption coefficient at 4 μm is about 2017 cm$^{-1}$ at 80K (2366 cm$^{-1}$ at 150 K), while the In$_{0.8}$Ga$_{0.2}$As/InAs$_{0.65}$Sb$_{0.35}$ superlattice structure sample has an absorption coefficient of 2962 cm$^{-1}$ at 80K (3256 cm$^{-1}$ at 150 K).

Accordingly, experimental demonstration reveals that an approximately 30%-35% increase in the absorption coefficient may be achieved for an InGaAs/InAsSb ternary superlattice structure 10 compared to conventional InAs/InAsSb superlattice structures. When the ternary superlattice structure 10 is used in infrared sensors, the layer thickness 20 of a unit cell 13 may be reduced by approximately 50% with comparable sensitivity compared to InAs/InAsSb superlattice structures, which is extremely favorable for production. The superlattice structure 10 provided by the embodiments herein achieves an overall system cost-size-weight-and-power (CSWaP) reduction, and increases the reliability and sustainability, all of which are immensely beneficial for military and civilian applications. For example, infrared focal plane array cameras are highly sought for various commercial/civilian applications such as medical imaging, manufacturing, night vision, thermography, imaging in weather satellites, and astronomy, which may utilize the features provided by the embodiments herein.

Figure 13A:
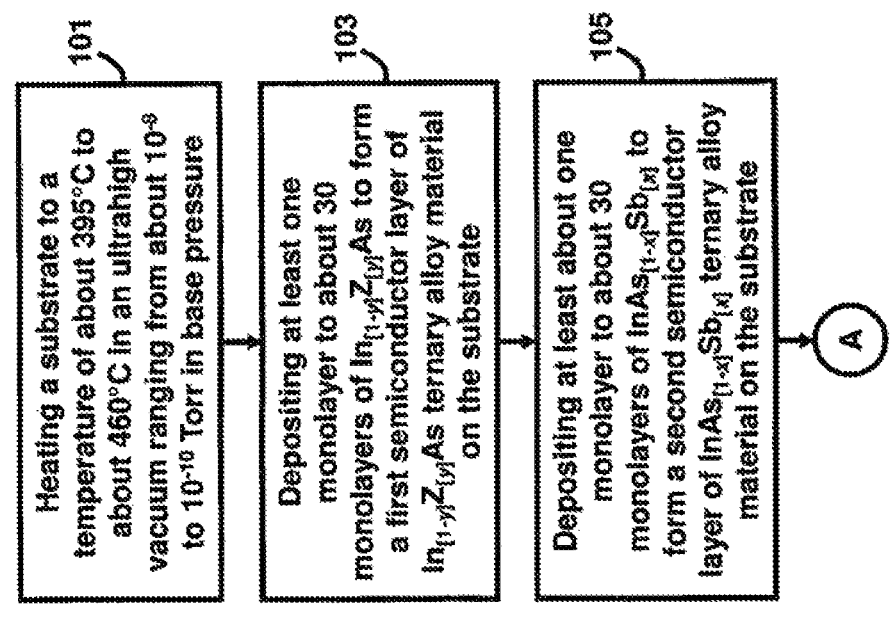
FIGS. 13A and 13B are flow diagrams illustrating methods of fabricating a superlattice structure, according to an example.

FIG. 13A, with reference to FIGS. 1A through 12, illustrates a method 100 of forming a ternary superlattice structure 10, the method 100 comprising heating (101) a substrate 12 to a temperature of about 395° C. to about 460° C. in an ultrahigh vacuum ranging from about $10^{-8}$ to $10^{-10}$ Torr in base pressure. Next, the method 100 provides depositing (103) at least one monolayer to about 30 monolayers of $In_{[1-y]}Z_{[y]}As$ to form a first semiconductor layer 14 of $In_{[1-y]}Z_{[y]}As$ ternary alloy material on the substrate 12, wherein Z is selected from the group comprising of Ga and Al. The method 100 further includes depositing (105) at least about one monolayer to about 30 monolayers of $InAs_{[1-x]}Sb_{[x]}$ to form a second semiconductor layer 16 of $InAs_{[1-x]}Sb_{[x]}$ ternary alloy material on the substrate 12, wherein x is in a range from greater than zero and less than 1, and y is in a range from greater than zero and less than 1, and wherein a thickness of the first and second semiconductor layers are substantially similar and configured to absorb light in a predetermined spectral band, to increase an absorption coefficient, and to increase an electron and hole mobility through the ternary superlattice structure 10 and prevent trapping of electrons in any particular layer.

In an example, y is in a range from about 0.05 to about 0.35. In an example, x is in a range from about 0.2 to about 0.8. The rate of deposition to form either the first semiconductor layer 14 of $In_{[1-y]}Z_{[y]}As$ ternary alloy material or the second semiconductor layer 16 of $InAs_{[1-x]}Sb_{[x]}$ ternary alloy material may be in a range from about 0.4 monolayers per second to about 1.5 monolayers per second, according to an example. The first semiconductor layer 14 of $In_{[1-y]}Z_{[y]}As$ ternary alloy material may comprise between about 1 to about 20 $In_{[1-y]}Z_{[y]}As$ monolayers, and the second semiconductor layer 16 of $InAs_{[1-x]}Sb_{[x]}$ ternary alloy material may comprise between about 1 to about 20 $InAs_{[1-x]}Sb_{[x]}$ monolayers, wherein a sum of the $In_{[1-y]}Z_{[y]}As$ monolayers and the $InAs_{[1-x]}Sb_{[x]}$ monolayers may be about 30 or less, according to various examples.

Figure 13B:
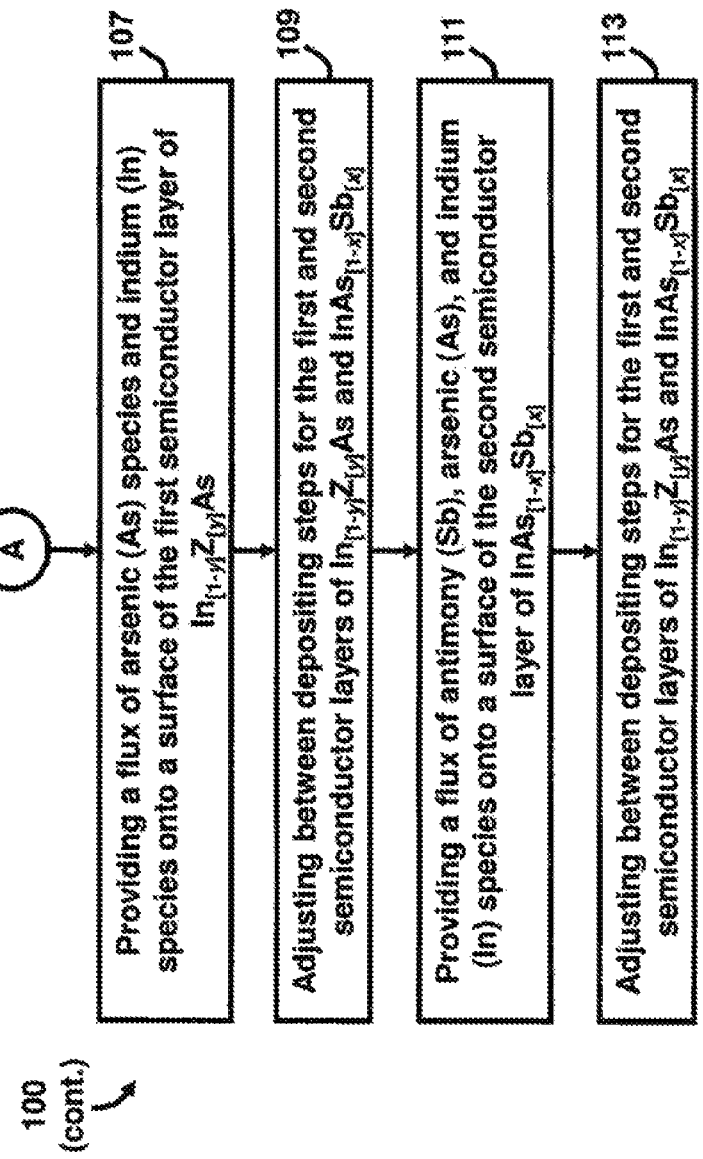

As shown in FIG. 13B, with reference to FIGS. 1A through 13A, the method 100 may further comprise providing (107) a flux of arsenic (As) and indium (In) species onto a surface of the first semiconductor layer 14 of $In_{[1-y]}Z_{[y]}As$, wherein the flux of arsenic (As) species provides an overpressure of arsenic sufficient to suppress any evaporation of arsenic from the ternary superlattice structure 10; adjusting (109) between the depositing steps for the first and second semiconductor layers 14, 16 of $In_{[1-y]}Z_{[y]}As$ and $InAs_{[1-x]}Sb_{[x]}$, wherein the arsenic and antimony fluxes are changed; providing (111) a flux of antimony (Sb), arsenic (As), and indium (In) species onto a surface of the second semiconductor layer 16 of $InAs_{[1-x]}Sb_{[x]}$, wherein the flux of antimony (Sb) and arsenic (As) species provides an overpressure sufficient to suppress any evaporation of arsenic and antimony from the ternary superlattice structure 10; and adjusting (113) between the depositing steps for the first and second semiconductor layers 14, 16 of $In_{[1-y]}Z_{[y]}As$ and $InAs_{[1-x]}Sb_{[x]}$, wherein the arsenic and antimony fluxes are changed.

Figure 14:
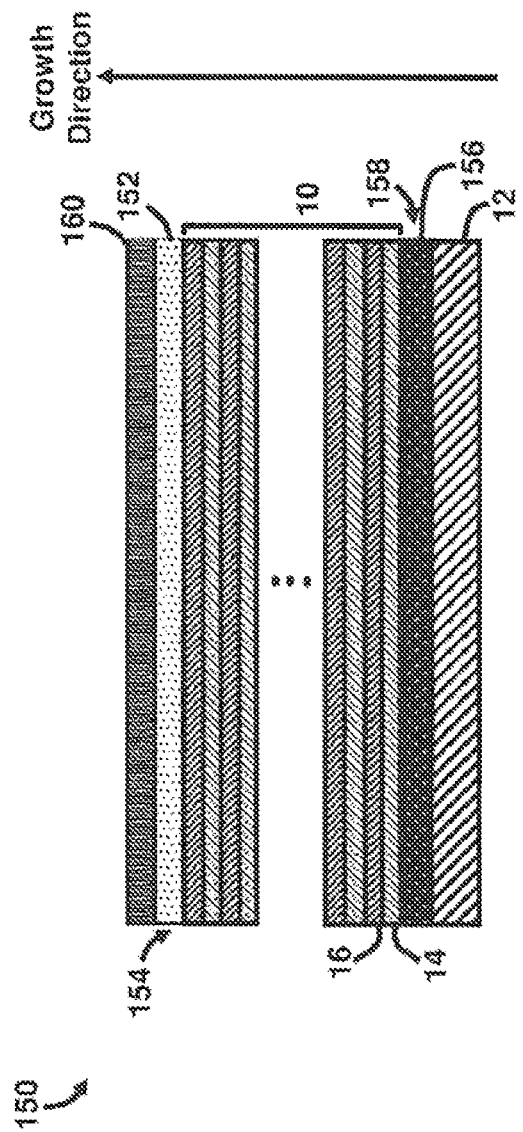
FIG. 14 is a schematic diagram illustrating an infrared absorbing detector, according to an example.

FIG. 14, with reference to FIGS. 1A through 13B, illustrates an infrared absorbing detector 150 comprising an infrared absorbing ternary superlattice structure 10 comprising a substrate 12 and alternating semiconductor layers comprising a first layer 14 of $InAs_{[1-x]}Sb_{[x]}$ ternary alloy material, and a second layer 16 of $In_{[1-y]}Z_{[y]}As$ ternary alloy material, wherein Z is Ga or Al, wherein x is in a range of greater than zero and less than one, wherein y is in a range of greater than zero and less than one. The detector 150 further comprises a unipolar barrier layer 152 on a first side 154 of the ternary superlattice structure 10 and configured to permit transport of one type of carriers across the barrier layer 152, wherein a bandgap of the barrier layer 152 is greater than the bandgap of the ternary superlattice structure 10. A first contact layer 156 is provided on a second side 158 of the ternary superlattice structure 10 above the substrate 12. A second contact layer 160 is provided adjacent to the unipolar barrier layer 152. In an example, y is in a range from about 0.05 to about 0.35. In an example, x is in a range of about 0.2 to about 0.8. According to some examples, the ternary superlattice structure 10 is doped n-type to yield a desired electron concentration in the ternary superlattice structure 10 and the first contact layer 156 and the second contact layer are also doped n-type. In an example, the electron transport between the second contact layer 160 and the first contact layer 156 is substantially blocked by the barrier layer 152. In another example, the second contact layer 160 is a p-type doped layer.

In an example, the barrier layer 152 may comprise an offset between a conduction band of the ternary superlattice structure 10 and a conduction band of the barrier layer 152 to block a transport of electrons across the barrier layer 152 (see FIG. 5 as an example of such an offset in the conduction bands 57), wherein valence bands of the ternary superlattice structure 10, the barrier layer 152, the first contact layer 156, and the second contact layer 160 are substantially aligned to allow transport of holes between the ternary superlattice structure 10, the barrier layer 152, the first contact layer 156, and the second contact layer 160 (see FIG. 5 as an example of such an alignment of the valence bands 56). In another example, the barrier layer 152 may comprise an offset between a valence band of the ternary superlattice structure 10 and a valence band of the barrier layer 152 to block a transport of holes across the barrier layer 152 (see FIG. 8 as an example of such an alignment of the valence bands 76), wherein conduction bands of the ternary superlattice structure 10, the barrier layer 152, the first contact layer 156, and the second contact layer 160 are substantially aligned to allow transport of electrons between the ternary superlattice structure 10, the barrier layer 152, the first contact layer 156, and the second contact layer 160. In another example, the barrier layer 152 may comprise a ternary superlattice structure 10 comprising alternating semiconductor layers comprising a first layer 14 of $InAs_{[1-x]}Sb_{[x]}$ ternary alloy material, and a second layer 16 of $In_{[1-y]}Z_{[y]}As$ ternary alloy material, wherein Z is Ga or Al, wherein x is in a range of greater than zero and less than one, and wherein y is in a range of greater than zero and less than one. In an example, the barrier layer 152 may be undoped or lightly doped thereby keeping the carrier concentration in the barrier layer 152 minimal.

The embodiments herein may be used to construct infrared (IR) detectors and focal plane arrays (FPAs), which are key components in military and civilian applications including medical and imaging devices.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Those skilled in the art will recognize that the embodiments herein can be practiced with modification within the spirit and scope of the appended claims.

What is claimed is:

1. An infrared absorbing detector comprising:
   an infrared absorbing ternary superlattice structure comprising a substrate and alternating semiconductor layers comprising:
      a first layer of $InAs_{[1-x]}Sb_{[x]}$ ternary alloy material, and
      a second layer of $In_{[1-y]}Z_{[y]}As$ ternary alloy material,
      wherein Z is Ga or Al, wherein x is in a range of greater than zero and less than one, wherein y is in a range of greater than zero and less than one;
   a unipolar barrier layer on a first side of the ternary superlattice structure and configured to permit transport of one type of carriers across the barrier layer, wherein a bandgap of the barrier layer is greater than the bandgap of the ternary superlattice structure;
   a first contact layer on a second side of the ternary superlattice structure above the substrate; and
   a second contact layer adjacent to the unipolar barrier layer.

2. The infrared absorbing detector of claim 1, wherein y is in a range from about 0.05 to about 0.35.

3. The infrared absorbing detector of claim 1, wherein x is in a range of about 0.2 to about 0.8.

4. The of claim 1 wherein the barrier layer comprises an offset between a conduction band of the ternary superlattice structure and a conduction band of the barrier layer to block a transport of electrons across the barrier layer, wherein valence bands of the ternary superlattice structure, the barrier layer, the first contact layer, and the second contact layer are substantially aligned to allow transport of holes between the ternary superlattice structure, the barrier layer, the first contact layer, and the second contact layer.

5. The infrared absorbing detector of claim 1, wherein the barrier layer comprises an offset between a valence band of the ternary superlattice structure and a valence band of the barrier layer to block a transport of holes across the barrier layer, wherein conduction bands of the ternary superlattice structure, the barrier layer, the first contact layer, and the second contact layer are substantially aligned to allow transport of electrons between the ternary superlattice structure, the barrier layer, the first contact layer, and the second contact layer.

6. The infrared absorbing detector of claim 1, wherein the barrier layer comprises a ternary superlattice structure comprising alternating semiconductor layers comprising:
   a first layer of $InAs_{[1-x]}Sb_{[x]}$ ternary alloy material, and
   a second layer of $In_{[1-y]}Z_{[y]}As$ ternary alloy material,
   wherein Z is Ga or Al, wherein x is in a range of greater than zero and less than one, and wherein y is in a range of greater than zero and less than one.

7. An infrared absorbing detector comprising a ternary superlattice structure comprising:
   a substrate; and
   a non-changing periodic layer structure on the substrate and comprising alternating infrared absorbing semiconductor materials comprising:
      a first layer of $InAs_{[1-x]}Sb_{[x]}$ ternary alloy material, and
      a second layer of $In_{[1-y]}Z_{[y]}As$ ternary alloy material,
      wherein Z is Ga or Al, wherein x is in a range of greater than zero and less than one, wherein y is in a range of greater than zero and less than one, and wherein the range of the thickness ratio of the first and second layers is 3:1-1:3 and the first and second layers are configured to absorb light in a predetermined spectral band and prevent trapping of carriers in any particular layer; and
   a unipolar barrier layer on a first side of the ternary superlattice structure and configured to permit transport of one type of carriers across the barrier layer, wherein a bandgap of the barrier layer is greater than the bandgap of the ternary superlattice structure;
   a first contact layer on a second side of the ternary superlattice structure above the substrate; and
   a second contact layer adjacent to the unipolar barrier layer.

8. The infrared absorbing detector of claim 7, wherein for said ternary superlattice structure y is in a range from about 0.05 to about 0.35.

9. The infrared absorbing detector of claim 7, wherein for said ternary superlattice structure x is in a range of about 0.2 to about 0.8.

10. The infrared absorbing detector of claim 7, wherein for said ternary superlattice structure the first layer of $InAs_{[1-x]}Sb_{[x]}$ ternary alloy material comprises at least one monolayer to about 30 monolayers.

11. The infrared absorbing detector of claim 7, wherein for said ternary superlattice structure the second layer of $In_{[1-y]}Z_{[y]}As$ ternary alloy materials comprises at least one monolayer to about 30 monolayers.

12. The infrared absorbing detector of claim 7, wherein for said ternary superlattice structure the first layer of $InAs_{[1-x]}Sb_{[x]}$ ternary alloy material comprises at least one monolayer to about 20 monolayers, wherein the second layer of $In_{[1-y]}Z_{[y]}As$ ternary alloy materials comprises at least one monolayer to about 20 monolayers, and wherein a total of $InAs_{[1-x]}Sb_{[x]}$ ternary alloy material monolayers and $In_{[1-y]}Z_{[y]}As$ ternary alloy material monolayers is less than 30.

13. The infrared absorbing detector of claim 7, wherein the non-changing periodic layer structure comprises bound holes and unbound electrons whose ground state is at most 10 meV below a highest conduction band minimum.

14. The infrared absorbing detector of claim 7, wherein for said ternary superlattice structure a thickness of the non-changing periodic layer structure is configured based on a predetermined selection of an amount of infrared absorption within the periodic layer structure.

* * * * *